United States Patent
Cascino et al.

(10) Patent No.: US 9,450,076 B2
(45) Date of Patent: Sep. 20, 2016

(54) POWER LDMOS SEMICONDUCTOR DEVICE WITH REDUCED ON-RESISTANCE AND MANUFACTURING METHOD THEREOF

(71) Applicant: STMICROELECTRONICS S.R.L., Agrate Brianza (IT)

(72) Inventors: Salvatore Cascino, Gravina di Catania (IT); Leonardo Gervasi, San Giovanni la Punta (IT); Antonello Santangelo, Belpasso (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/601,081

(22) Filed: Jan. 20, 2015

(65) Prior Publication Data

US 2015/0206968 A1    Jul. 23, 2015

(30) Foreign Application Priority Data

Jan. 21, 2014 (IT) .............. TO2014A0037

(51) Int. Cl.
*H01L 29/76* (2006.01)
*H01L 29/66* (2006.01)
(Continued)

(52) U.S. Cl.
CPC ....... *H01L 29/66681* (2013.01); *H01L 27/088* (2013.01); *H01L 29/0634* (2013.01);
(Continued)

(58) Field of Classification Search
CPC .................. H01L 29/7816; H01L 29/66681; H01L 29/0634; H01L 29/7823; H01L 29/6656

USPC ....................................................... 257/339
See application file for complete search history.

(56) References Cited

U.S. PATENT DOCUMENTS 7,589,378 B2    9/2009    Kocon et al.
7,829,947 B2    11/2010   Hébert
(Continued)

FOREIGN PATENT DOCUMENTS

EP    1 577 952 A1    9/2005
EP    2 202 794 A2    6/2010
(Continued)

OTHER PUBLICATIONS

Shen et al., "Performance Analysis of Lateral and Trench Power MOSFETs for Multi-MHz Switching Operation," PowerSOC Workshop, Florida Power Electronics Center, School of Electrical Engineering and Computer Science, University of Central Florida, 24 pages.

*Primary Examiner* — Theresa T Doan
(74) *Attorney, Agent, or Firm* — Seed IP Law Group PLLC

(57) ABSTRACT

An electronic semiconductor device including a semiconductor body having a first structural region and a second structural region, which extends on the first structural region and houses a drain region; a body region, which extends into the second structural region; a source region, which extends into the body region; and a gate electrode, which extends over the semiconductor body for generating a conductive channel between the source region and the drain region. The device includes a first conductive trench extending through, and electrically insulated from, the second structural region on one side of the gate electrode; and a second conductive trench extending through the source region, the body region, and right through the second structural region on an opposite side of the gate electrode, electrically insulated from the second structural region and electrically coupled to the body region and to the source region.

19 Claims, 18 Drawing Sheets

(51) Int. Cl.

| | | |
|---|---|---|
| *H01L 29/78* | (2006.01) | |
| *H01L 29/06* | (2006.01) | |
| *H01L 29/10* | (2006.01) | |
| *H01L 29/08* | (2006.01) | |
| *H01L 29/417* | (2006.01) | |
| *H01L 27/088* | (2006.01) | |

(52) U.S. Cl.
CPC ....... *H01L29/0865* (2013.01); *H01L 29/0878* (2013.01); *H01L 29/0882* (2013.01); *H01L 29/1045* (2013.01); *H01L 29/1095* (2013.01); *H01L 29/41741* (2013.01); *H01L 29/41766* (2013.01); *H01L 29/6656* (2013.01); *H01L 29/66659* (2013.01); *H01L 29/66696* (2013.01); *H01L 29/66727* (2013.01); *H01L 29/7802* (2013.01); *H01L 29/7816* (2013.01); *H01L 29/7823* (2013.01); *H01L 29/7835* (2013.01)

(56) References Cited

U.S. PATENT DOCUMENTS

| | | | |
|---|---|---|---|
| 7,936,007 | B2 | 5/2011 | Marchant et al. |
| 8,193,559 | B2 | 6/2012 | Haeberlen et al. |
| 2002/0053699 | A1 | 5/2002 | Kim et al. |
| 2002/0175351 | A1 | 11/2002 | Baliga |
| 2007/0085204 | A1 | 4/2007 | Korec et al. |
| 2010/0237411 | A1 | 9/2010 | Hsieh |
| 2010/0237416 | A1* | 9/2010 | Hebert .......... 257/343 |
| 2010/0327348 | A1 | 12/2010 | Hashimoto et al. |
| 2011/0127602 | A1 | 6/2011 | Mallikarjunaswamy |
| 2013/0313640 | A1* | 11/2013 | Shen et al. ...... 257/336 |
| 2014/0197487 | A1* | 7/2014 | Cascino et al. .... 257/337 |

FOREIGN PATENT DOCUMENTS

| | | |
|---|---|---|
| JP | 2009-81385 A | 4/2009 |
| WO | 2011/054009 A2 | 5/2011 |

* cited by examiner

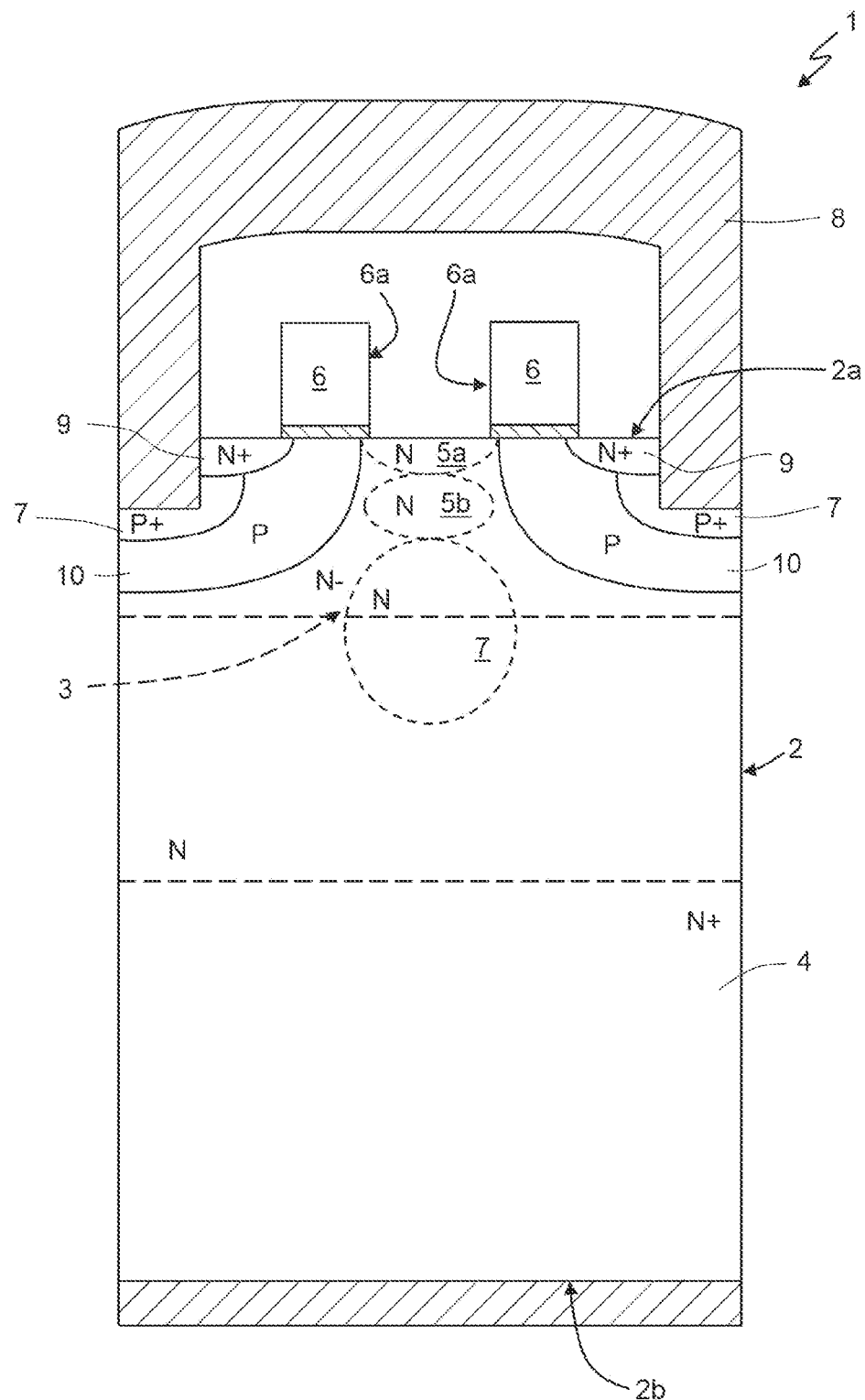
FIG. 1 *(Prior Art)*

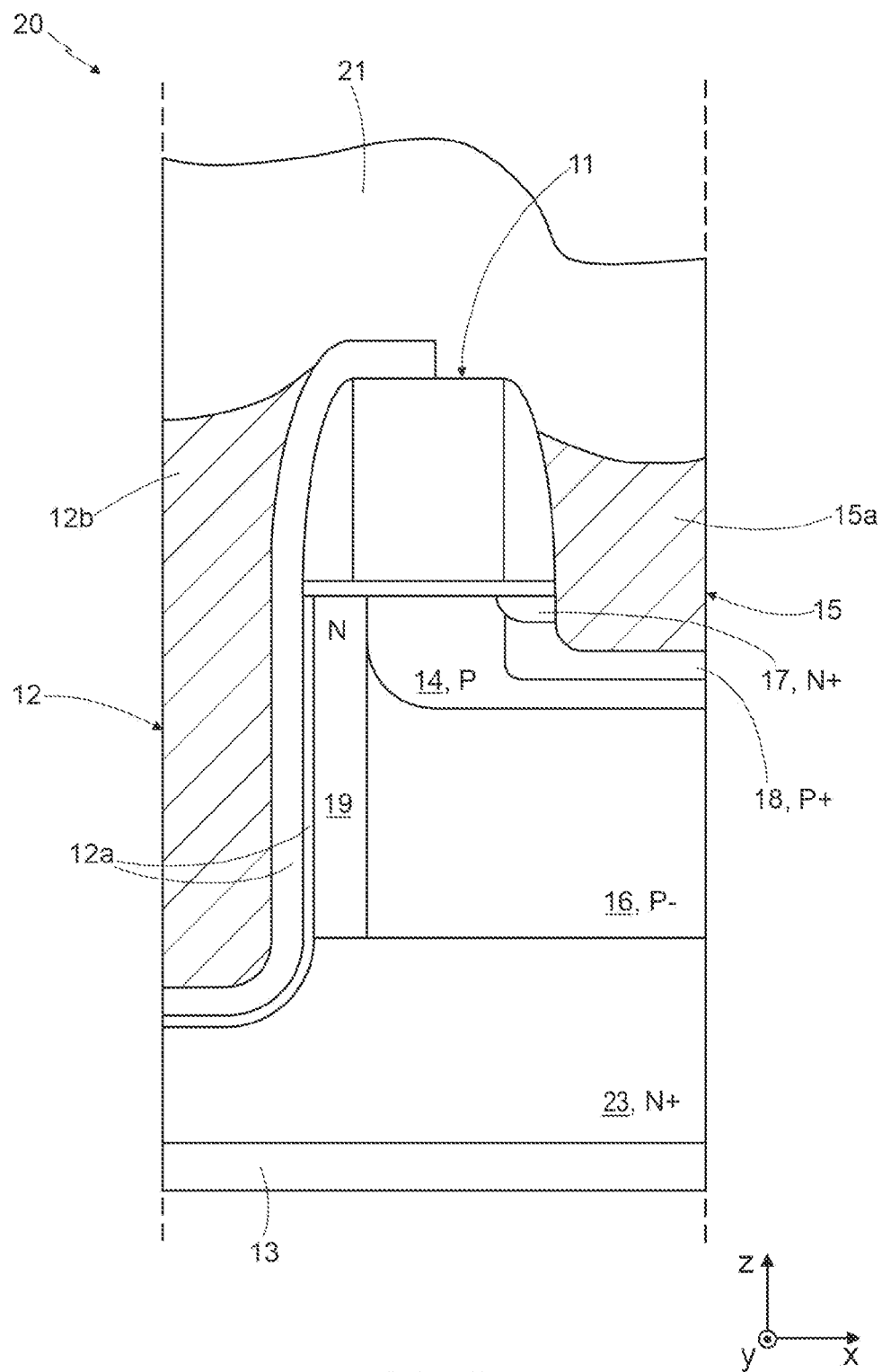
FIG. 2 *(Prior Art)*

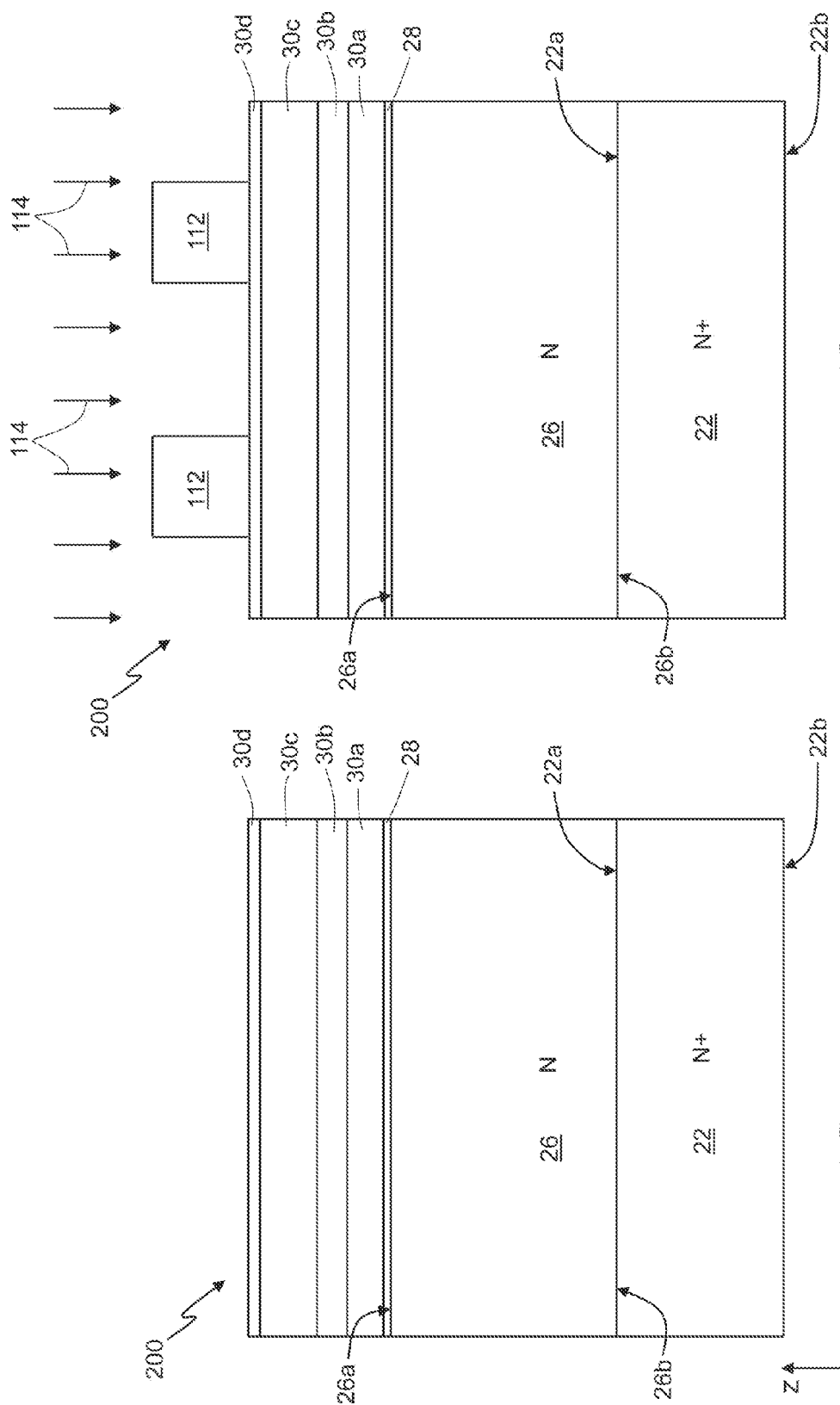

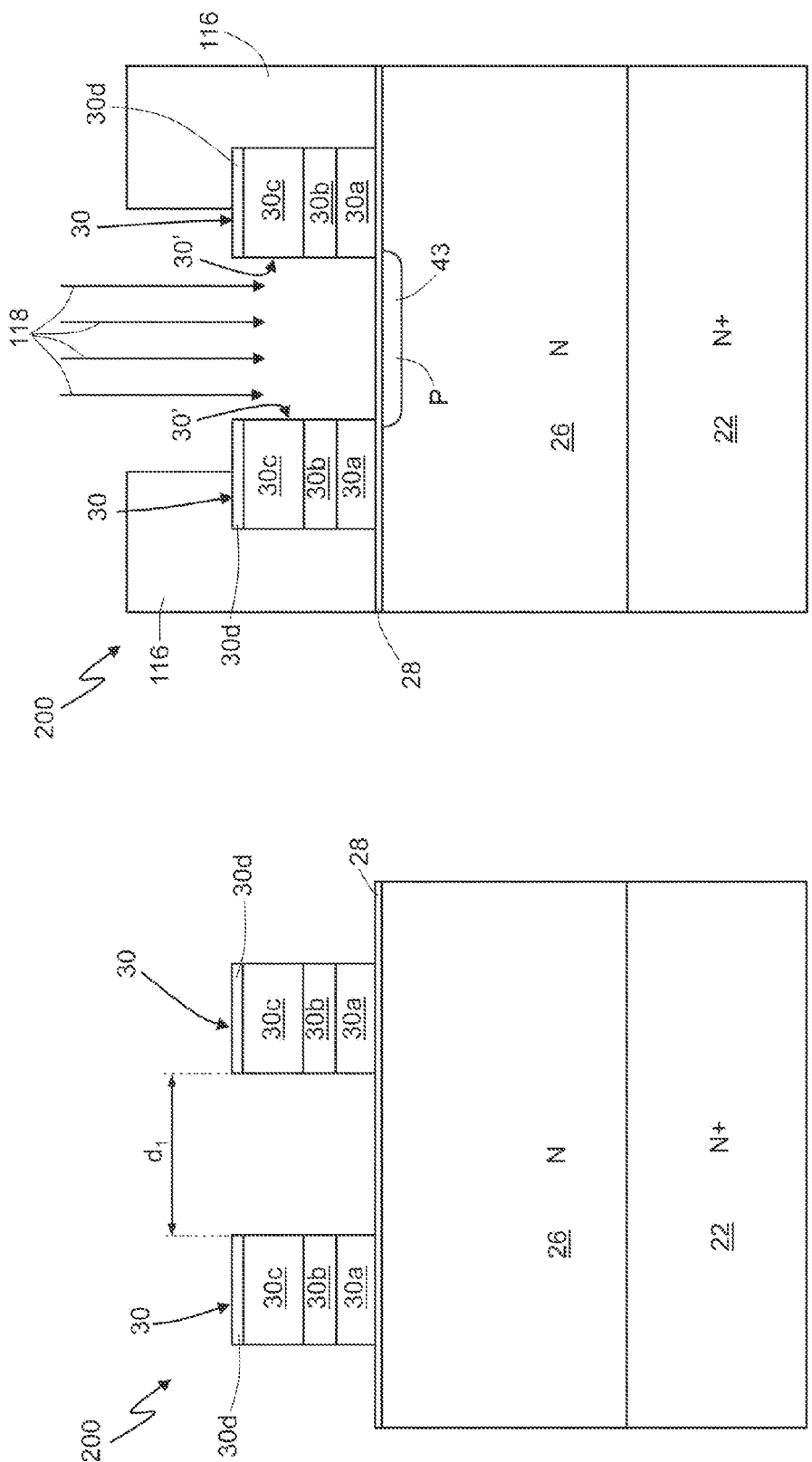

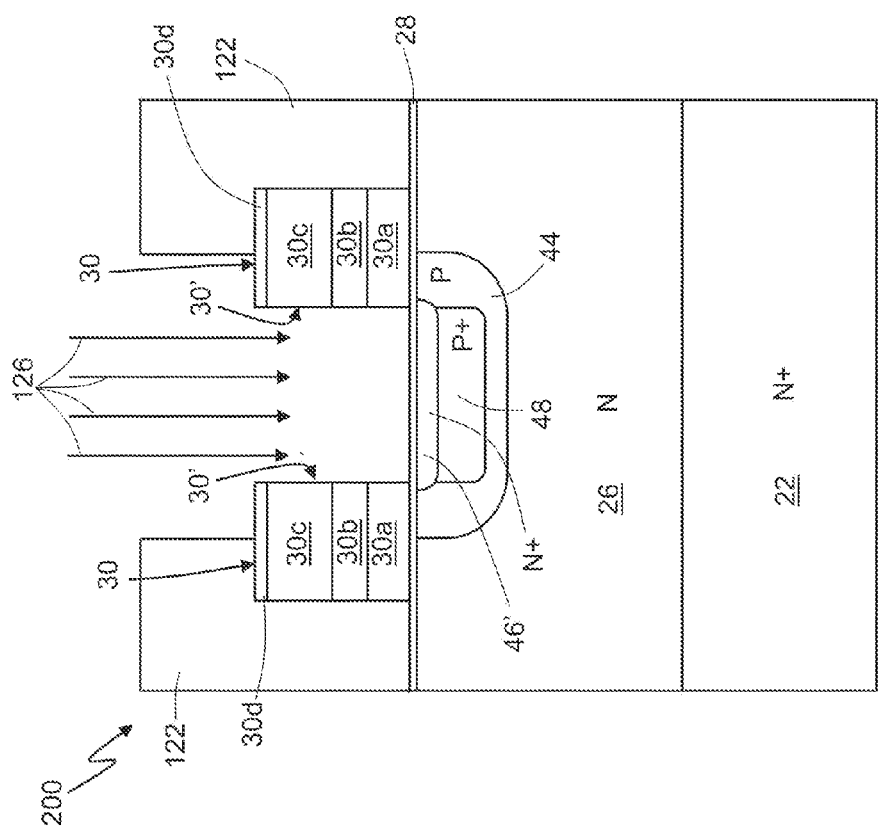
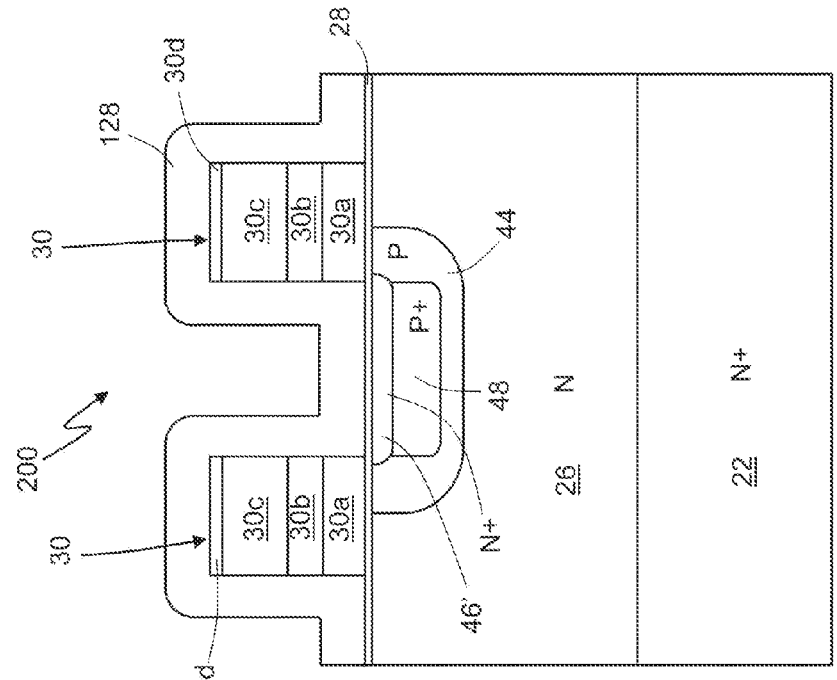
FIG. 11
FIG. 10

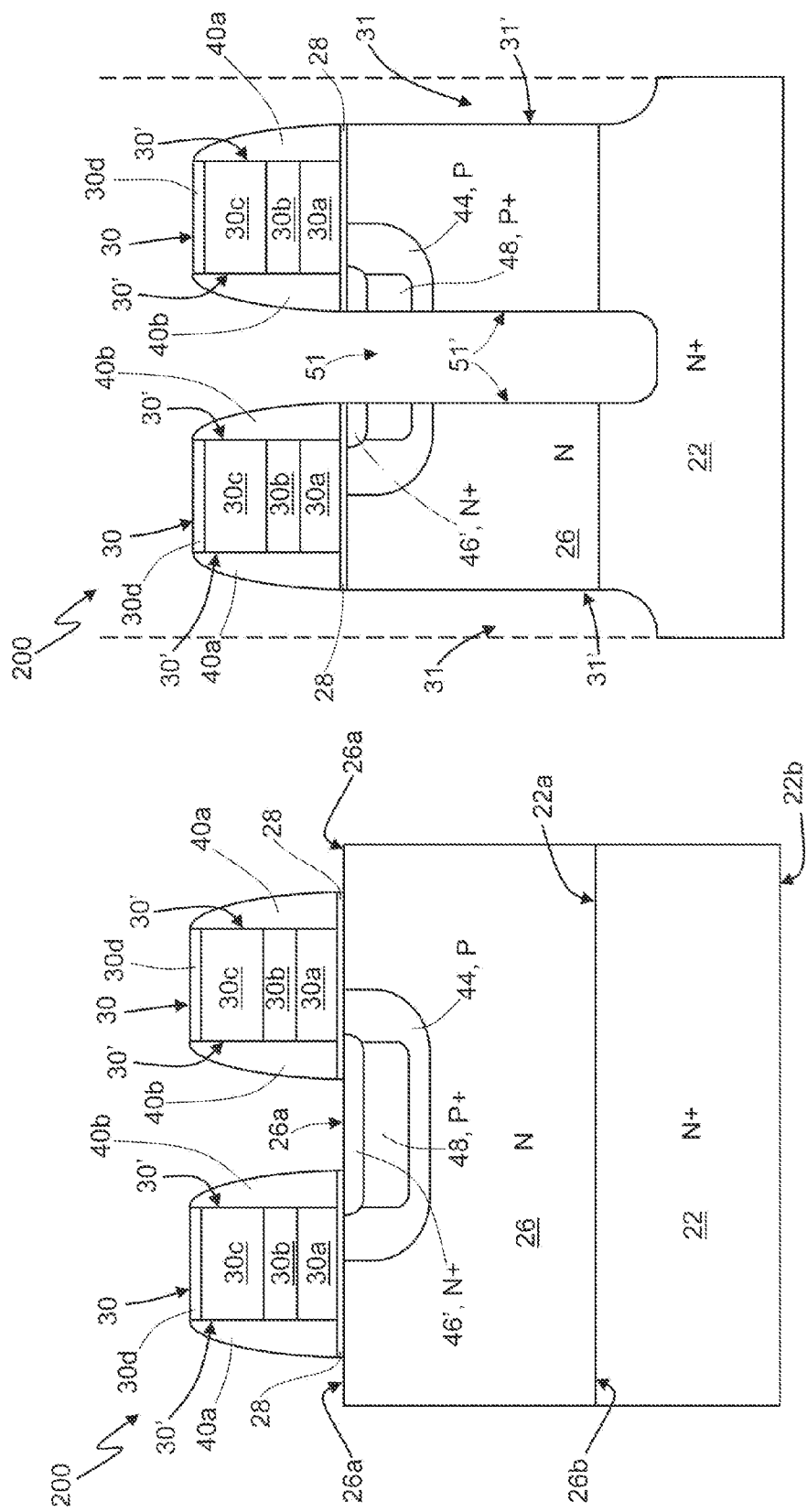

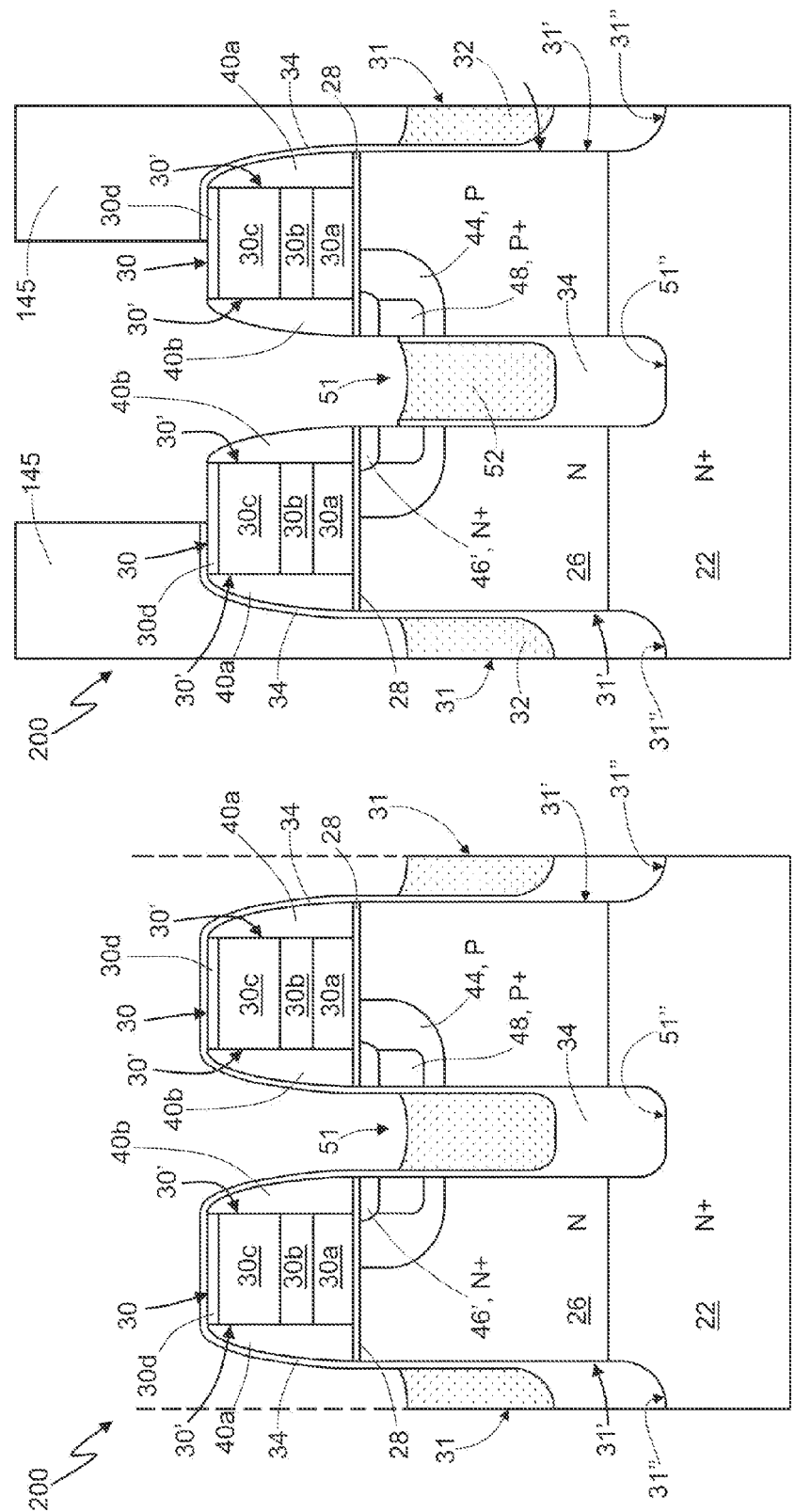

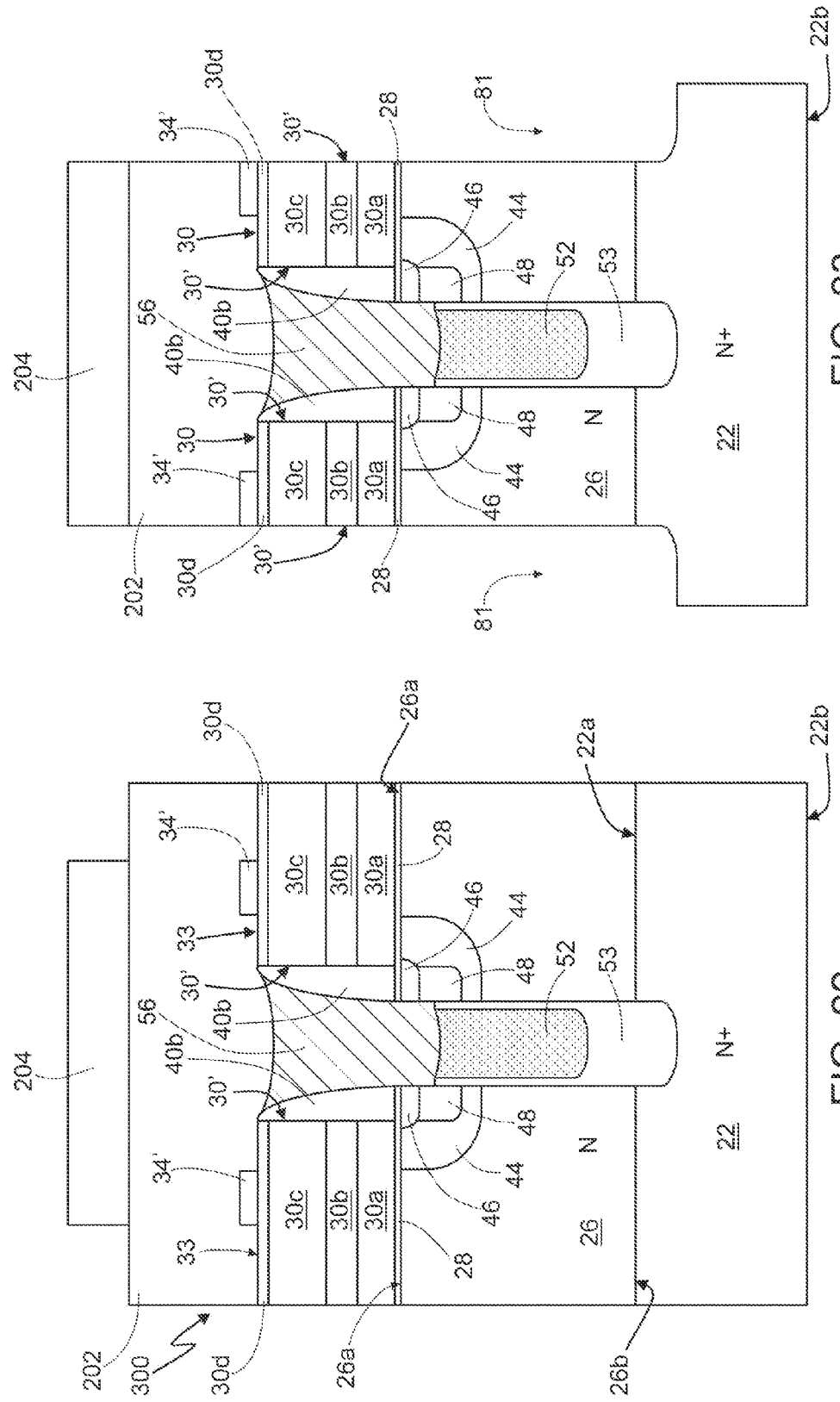

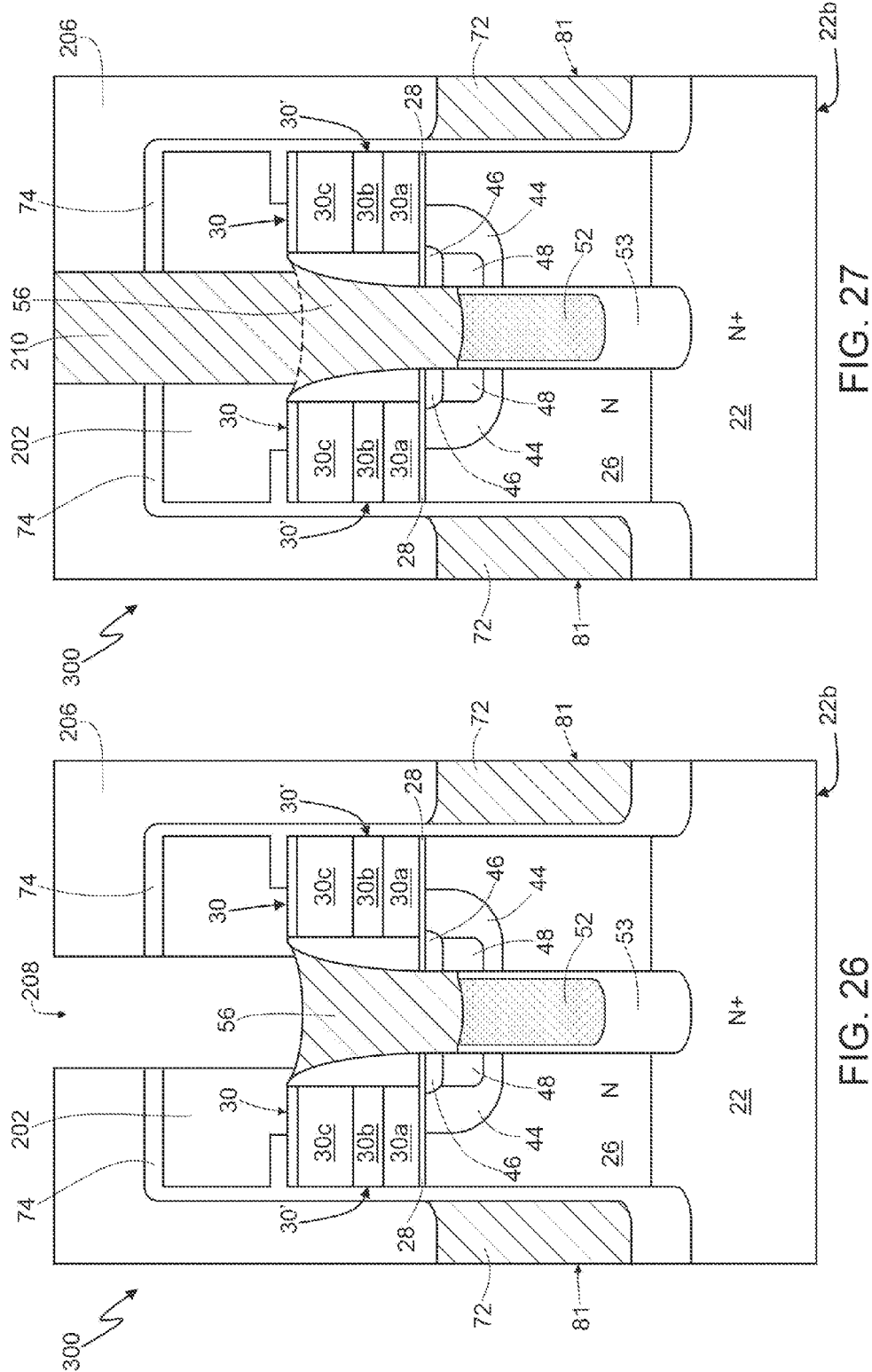

POWER LDMOS SEMICONDUCTOR DEVICE WITH REDUCED ON-RESISTANCE AND MANUFACTURING METHOD THEREOF

BACKGROUND

1. Technical Field

The present disclosure relates to an LDMOS semiconductor device and to a manufacturing method thereof.

2. Description of the Related Art

As is known, some applications of power MOSFET devices (or power MOSFETs) use said power MOSFETs for being driven at high switching frequencies. An example is that of electrical switches used in the field of high-frequency pulse-width modulation (PWM). To maximize the efficiency of the device it is expedient for the dynamic performance to exhibit a negligible loss of power during switching operations. This condition is verified by minimizing the values of capacitance of the parasitic capacitors inside said devices. Particular attention is be paid to minimization of the gate-to-drain capacitance $C_{GD}$, since said capacitance $C_{GD}$ determines the duration of the period of transient of the voltage signal during switching; it is thus of fundamental importance to minimize the value of capacitance $C_{GD}$ in order to minimize the power losses of the power MOSFET. A parameter that is strictly linked to parasitic capacitances and is typically used to characterize the efficiency of a power MOSFET in switching, is the gate charge $Q_G$; in fact, the value of gate charge $Q_G$ provides an estimate of the amount of current that is be supplied to the gate terminal of the power MOSFET to obtain switching of the device from the OFF state (where it does not conduct electric current) to the ON state (where there is conduction of electric current between the source and drain terminals).

LDMOSs (lateral double-diffused MOSFETs) may advantageously be used in a wide range of frequencies, with powers that range from a few watts to some hundred watts. A classic LDMOS structure comprises a substrate that has, in lateral sectional view, a horizontal sequence constituted by a laterally diffused low-resistance area (of a P+ type and referred to as "sinker"), a source region, a gate region, and a lightly doped drain (LDD) that provides the drain terminal. The LDD region further faces a surface of the substrate. This structure of a known type forms, for obvious reasons, an elementary cell with a high "pitch".

Lateral MOS transistors have been widely studied, and in the literature techniques are known for minimizing the internal capacitances and for obtaining values of drain-to-source ON-resistance ($R_{DS\_ON}$) comparable with the values of trench-FET technology.

FIG. 1 shows an LDMOS transistor of a known type, in particular described in U.S. Pat. No. 7,936,007. With reference to FIG. 1, illustrated therein is a lateral sectional view of a structure designed to minimize the pitch of the base cell of an LDMOS. In this case, an LDMOS transistor 1 includes a substrate 2 having a top surface 2a and a bottom surface 2b opposite to one another, where an LDD region 3 extends starting from the top surface 2a of the substrate 2 towards the bottom surface 2b (without reaching the bottom surface 2b). Present above the bottom surface 2b is a drain region 4. The LDD region 3 is obtained via formation, starting from the top surface 2a of the substrate 2, of implanted regions 5a and 5b, of an N type, self-aligned to the gate terminal 6 and set between two gate terminals 6 set alongside one another; a sinker region 7 extends into the substrate 2, adjacent to body regions 10 and underneath source regions 9. A conductive layer 8 extends over, and is electrically insulated from, the gate terminal 6, and penetrates into the substrate 2 until it contacts the source regions 9 and sinker regions 7.

To minimize the parasitic capacitance between the gate terminal 6 and the LDD region 3, the structure illustrated in FIG. 1 may be modified so that the conductive layer 8 extends over the side wall 6a of the gate terminal 6, above the LDD region 3. By connecting the conductive layer 8 to a reference ground terminal, a conductive "shield" is formed designed to attenuate the hot-carrier injection (HCI) phenomenon and improve the gate-to-drain decoupling. Furthermore, a dielectric layer should be provided for separating the portion of the conductive layer 8 that extends over the LDD region 3 from the top surface 2a of the substrate 2. This dielectric separation layer preferably has a thickness in the region of 100-200 nm. A solution that goes in this direction is the one described in U.S. Pat. No. 7,589,378 (not illustrated in the figures). This document proposes an LDMOS transistor with surface LDD region, in which a conductive shield extends over the gate terminal and alongside it, over the LDD region and separated from the latter by a dielectric layer. In this way, a reduction of the electrical field is obtained, with consequent benefit in terms of increase in drain-to-source ON-resistance $R_{DS\_ON}$ and attenuation of the value of gate-to-drain capacitance. As mentioned previously, the solution with surface LDD region imposes constraints on the minimum pitch that may be obtained, which may be further reduced only at the expense of the value of breakdown voltage, which is considerably reduced.

Alternatively, more complex processes may be adopted, of the type described in U.S. Pat. No. 7,829,947, where a power LDMOS has a region of field oxide under the gate region to minimize the capacitance between the gate region and the LDD region. The above device, however, is extremely difficult to manufacture as regards controlling superposition between the LDD region and the gate region.

FIG. 2 shows a cross section of an elementary cell of a power device according to a further embodiment of a known type, described in US Patent Publication No. 2014/0197487, filed in the name of STMicroelectronics S.r.l.

The device 20 of FIG. 2 is an electronic semiconductor device and comprises a semiconductor body including a substrate 23 (with N+ doping) and an epitaxial layer 16 (with P− doping). A body region 14, with P doping, extends into the epitaxial layer 16, and a source region 17, with N doping, extends into the body region 14. The region 18, within the body region 14 and electrically coupled to the source region 17, is an enrichment region, with P+ doping. A drain region 19, with N doping, extends vertically into the epitaxial layer, alongside the body region 14 and is electrically coupled to a back metallization 13 through the substrate 23. A gate electrode 11 extends over the epitaxial layer 16 between the source region and the drain region 19.

A first trench 12 extends through the epitaxial layer and houses a trench dielectric region 12a (for example, comprising a plurality of dielectric layers) and a first trench conductive region 12b within the trench dielectric region. A second trench 15 extends through part of the epitaxial layer 16 within the body region 14 and terminates in the body region 14. The second trench 15 houses a second trench conductive region 15a in electrical contact with the body region 14 and with the source region 16. As has been said, the drain region 19 extends through the epitaxial layer 16 until it reaches and contacts the substrate 23, and is set between, and in direct contact with, the body region 14 and the trench dielectric region 12a. The first and second trench conductive regions are further electrically coupled to one another and to a ground reference terminal by a metallization 21.

The device of FIG. 2 enables minimization of the parasitic internal capacitances, reducing the gate charge $Q_G$, and consequently enables a good value of figure of merit (FOM) for being obtained. The specific drain-to-source ON-resistance $R_{DS\_ON}$ is kept at relatively low values thanks to the high doses of LDD used. This solution makes it possible to obtain a fast device at the expense of area occupied.

BRIEF SUMMARY

One embodiment of the present disclosure is directed to an electronic semiconductor device having a semiconductor body having a first side and a second side opposite to one another along an axis. The semiconductor body includes a first structural region facing the second side and having a first conductivity and a second structural region extending over the first structural region, facing the first side and housing a drain region. A body region, having a second conductivity opposite to the first conductivity extends into the second structural region on the first side. The device includes a source region, having the first conductivity, extending into the body region and facing the first side and a gate electrode, extending over a portion of the first side of the semiconductor body, configured to generate a conductive channel in said body region between the source region and the drain region. The device includes a first trench, extending completely through the second structural region at a first side of the gate electrode and housing a first trench conductive region electrically insulated from the second structural region and a second trench, extending completely through the source region, the body region, and the second structural region at a second side opposite to the first side, of the gate electrode, said second trench housing a second trench conductive region electrically insulated from the second structural region and electrically coupled to the body region and to the source region.

BRIEF DESCRIPTION OF THE SEVERAL VIEWS OF THE DRAWINGS

For a better understanding of the present disclosure preferred embodiments thereof are now described, purely by way of non-limiting example, with reference to the annexed drawings, wherein:

FIGS. 1 and 2 illustrate, in lateral sectional view, respective devices of a known type;

FIGS. 4-18 show, in lateral sectional view, steps for manufacturing a power device comprising two elementary cells of the type illustrated in FIG. 3A;

FIGS. 20-27 show, in lateral sectional view, steps for manufacturing a power device comprising two elementary cells of the type illustrated in FIG. 19;

DETAILED DESCRIPTION

According to the present disclosure a power device is provided, in particular a lateral double-diffused MOS (LD-MOS) transistor with drain electrode on the back of the device.

Figure 3A:
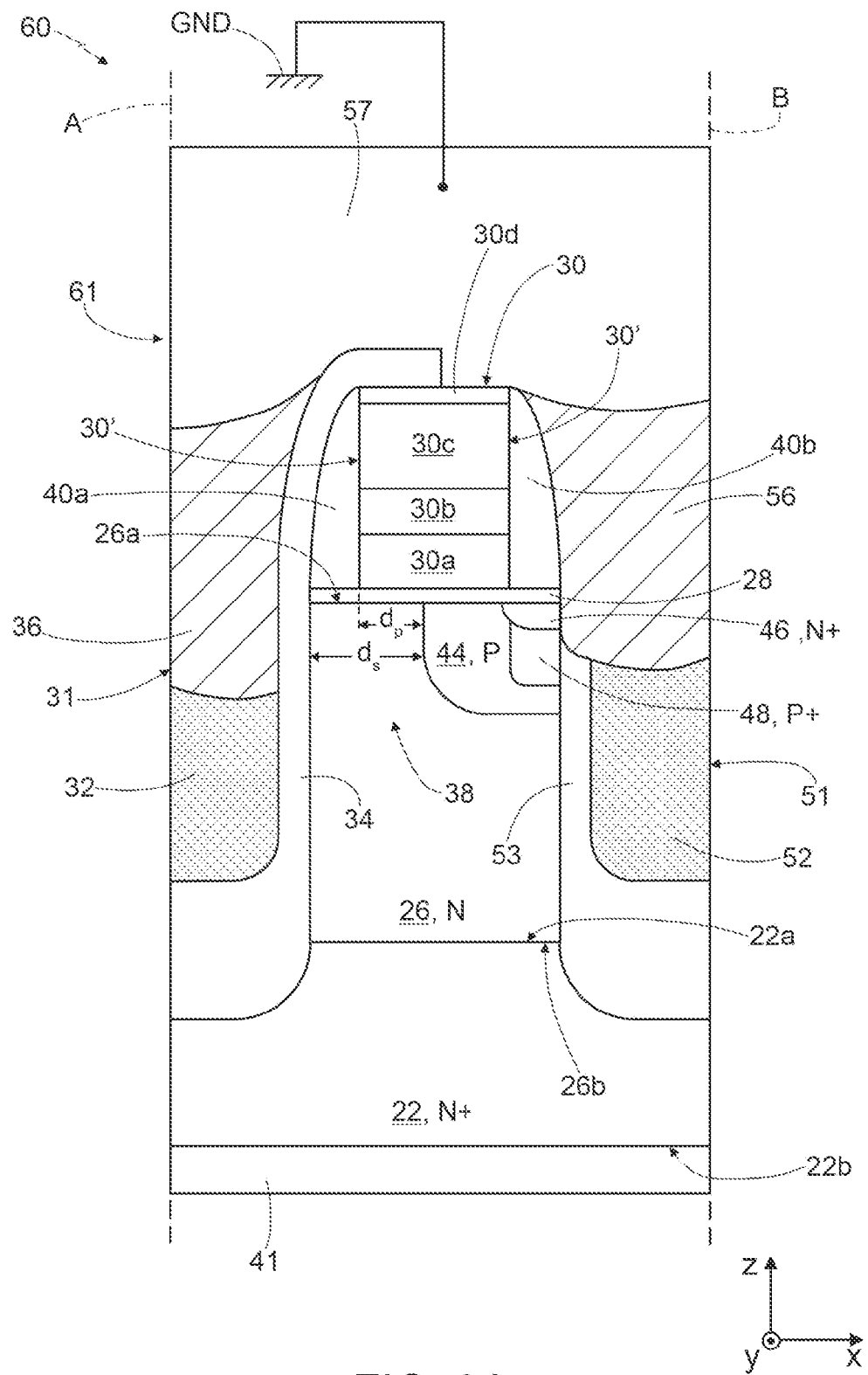
FIG. 3A shows, in lateral sectional view, an elementary cell of a power device according to one embodiment of the present disclosure.

FIG. 3A is a schematic view, in lateral section, of a portion of a power device 60. The view of FIG. 3A represents an elementary cell 61 of the power device 60; the latter may comprise a single elementary cell 61 or a plurality of elementary cells of the type illustrated in FIG. 3A. The elementary cell 61 extends from the segment A to the segment B, and the portion comprised between A and B may be ideally and graphically replicated and subsequently reflected specularly with respect to the segment A and/or to the segment B to obtain a power device 60 comprising a plurality of elementary cells 61.

The elementary cell 61 of FIG. 3A comprises a substrate 22, made of semiconductor material, such as for example silicon having a first conductivity (with N+ doping); the substrate 22 is delimited by a first side 22a and by a second side 22b opposite to one another in a direction Z.

Extending over the substrate 22, having a resistivity comprised between approximately 1 mΩ·cm and 5 mΩ·cm, is a structural layer or region 26, for example made of epitaxially grown silicon, having the first conductivity (of an N type), and a concentration of dopants comprised between $5 \cdot 10^{16}$ and $1 \cdot 10^{17}$ ions/cm$^3$. The structural region 26 has a thickness, along Z, chosen according to the application and, in particular, comprised between approximately 1 μm and 1.3 μm. It is evident that other values may be chosen, for example any value of thickness from 0.6 μm upwards. In use, part of the structural region 26 operates as drain region of the device 60.

The structural region 26 is delimited by a first side 26a and a second side 26b opposite to one another in the direction Z. The second side 26b of the structural region 26 is set facing the first side 22a of the substrate 22; according to one embodiment, the second side 26b of the structural region 26 is in direct electrical contact with the first side 22a of the substrate 22; according to alternative embodiments (not shown), one or more further structural regions, for example grown epitaxially and similar to the structural region 26 and/or to the region 22, extend between the first side 22a of the substrate 22 and the second side 26b of the structural region 26.

Extending over the first side 26a of the structural region 26 is a dielectric layer 28, for example made of silicon oxide, having the function of gate oxide, with a thickness comprised between approximately 20 nm and 60 nm, more in particular between 35 nm and 45 nm.

A gate electrode 30 extends over the dielectric layer 28. The gate electrode 30 is formed by a stack of layers of polysilicon with N+ doping 30a, silicide 30b, insulating material 30c (e.g., silicon oxide), and silicon nitride 30d, set on top of one another. According to one embodiment, the silicide layer 30b is constituted by a metal layer, obtained by reaction with cobalt, or else via deposition of tungsten silicide in sequence with the polysilicon, or in any other way. The gate electrode 30 has, for example, a total thickness of approximately 0.4 μm.

Present on the second side 22b of the substrate 22 is a drain metallization 41, in electrical contact with the substrate 22. In use, the structural region 26, the substrate 22, and the metallization 41 form a drain electrode of the power device 60.

A first trench 31 extends in depth, in the direction Z, into the structural region 26 and into part of the substrate 22, and terminates in the substrate 22. The trench 31 extends alongside the gate electrode 30. A first trench conductive region 32 is housed within the trench 31 and is partially surrounded by at least one trench dielectric layer 34. As illustrated more fully hereinafter, the trench dielectric layer 34 covers the internal wall and the bottom of the trench 31, and the first trench conductive region 32 is in direct contact with the trench dielectric layer 34, which extends over the internal wall and the bottom of the trench 31.

The first trench conductive region 32 does not fill the trench 31 completely, but only partially. A first filling region 36, made of conductive material, for example metal, in particular tungsten, extends within the trench 31 in electrical contact with the first trench conductive region 32 until it fills the first trench 31 completely. According to an alternative embodiment, the first filling region 36 includes tungsten and titanium silicide.

The first trench conductive region 32 is, for example, made of doped polysilicon of an N type and extends in direct contact with the trench dielectric 34 facing the bottom of the first trench 31. The trench dielectric 34 surrounds the side wall of the trench 31 and the bottom of the trench 31 so that the portion of trench 31 that extends within the substrate 22 and as far as the interface between the structural region 26 and the substrate 22 is completely filled by the trench dielectric 34. Consequently, the first trench conductive region 32 extends into the trench 31 until it reaches a maximum depth, measured along Z starting from the face 26a, which is less than the depth, once again along Z starting from the face 26a, where the interface between the structural region 26 and the substrate 22 is located. The first filling region 36 extends until it comes into electrical contact with the first trench conductive region 32 until it reaches a height, along Z, substantially equal to the maximum height, along Z, reached by the gate electrode 30. The first filling region 36 is electrically insulated from the gate electrode 30 by the trench dielectric 34, which extends not only within the trench 31 but also along the side wall of the gate electrode 30.

The first filling region 36 is electrically insulated from the gate electrode 30 not only by the trench dielectric 34 but also by a further dielectric designated in the figure by the reference number 40a (described more fully hereinafter); further, it is evident that both the first trench conductive region 32 and the first filling region 36 are electrically insulated from the structural region 26 and from the substrate 22 by the trench dielectric 34.

The elementary cell 61 of FIG. 3 further comprises lateral spacers 40a, 40b (made of dielectric material) extending along side walls 30' of the gate electrode 30. In particular, the lateral spacer 40a extends between the gate electrode 30 and the trench dielectric 34, and is separated from the structural region 26 by the dielectric layer 28. The lateral spacer 40a has a maximum extension, measured in a direction X orthogonal to the direction Z, comprised between approximately 100 nm and 200 nm. This maximum extension is considered at the interface between the lateral spacer 40a and the dielectric layer 28 on which the lateral spacer 40a lies. The spacer 40b has the same or similar dimensions and shape of the spacer 40a and extends along the wall 30' opposite, in the direction X, to the wall 30' along which the spacer 40a extends. The spacers 40a and 40b are made of dielectric material, for example silicon oxide.

The elementary cell 61 further comprises a body region 44, which has a second conductivity (of a P type) opposite to the first conductivity, extends into the structural region 26 facing the first side 26a, and has a doping comprised between approximately $2 \cdot 10^{17}$ ions/cm$^3$ and $5 \cdot 10^{17}$ ions/cm$^3$.

In greater detail, the body region 44 extends into the structural region 26 for a depth in the direction Z, for example, of approximately 0.5 or 0.6 μm. Extending between the body region 44 and the first trench 31 is a portion of the structural region 26 having an extension $d_S$, measured along the axis X, comprised between approximately 300 nm and 500 nm, for example 350 nm.

Furthermore, a source region 46 extends into the body region 44, facing the first side 26a of the structural region 26, for a depth in the direction Z comprised, for example, between approximately 100 nm and 150 nm. The source region 46 has the first conductivity (e.g., of an N+ type) with a doping level of approximately $1 \cdot 10^{20}$ ions/cm$^3$, and overlaps, in top plan view, the gate electrode 30 by an amount, measured along the axis X, comprised, for example, between approximately 0.05 mm and 0.15 μm.

During use, the portion of the body region 44 comprised between the source region 46 and the structural region 26 houses the conductive channel of the power device 60.

The portion of the structural region 26 with doping of an N type, which surrounds the body region 44, participates, in use, in forming a drain electrode of the device 60, which receives the current from the source region 46. The metallization for the electrical drain contact is located, as has been said, at the face 22b of the substrate 22. Thus, an electric current I may flow vertically (along Z) through the portion of the structural region 26 having a doping of an N type and the substrate 22, reaching the drain metallization 41. Consequently, in the present description, the portion of the structural region 26 with doping of an N type, through which there flows, in use, the electric current I coming from the source region 46 and generated as a function of the voltage applied to the gate terminal, will be referred to as "drain region 38".

The first trench conductive region 32 and the filling region 36 form an electrode that may be connected to a reference voltage GND (for example, a ground reference voltage) designed to reduce the electrical field, and thus generation of hot electrons in the structural region 26 (when, in use, it operates as drain region of the transistor 60), in particular in the portion of the structural region 26 extending as far as in the proximity of the gate electrode 30. This affords a good control (in particular, a reduction) of the phenomena of trapping or injection of charges (known as "hot carrier injection") in the structural region 26.

The distance between the first trench conductive region 32 (or the filling region 36) and the structural region 26 may be adjusted according to the application by appropriately choosing the thickness of the trench dielectric 34.

The present applicant has found that a thin trench dielectric (for example, in the range of approximately 50-200 nm, extremes included) enables the first trench conductive region 32 and the first filling region 36 for being brought closer to the structural region 26, with consequent reduction of the electrical field (potential lines) in the portion of the structural region 26 facing the gate electrode 30. In this way, as has been said, the phenomenon of generation of hot electrons is minimal even with high doping concentrations of the structural region 26.

Furthermore, this affords an optimal compromise between control of the aforementioned electrical field and the dose of doping of the structural region 26, which, if increased with respect to solutions of a known type, enables reduction of the drain-to-source ON-resistance (resistance $R_{DS\_ON}$).

An enriched region 48 (p-well), which has the second conductivity and a value of doping greater than that of the body region 44 (of a P+ type, with a doping concentration in the region of $5 \cdot 10^{18}$ ions/cm$^3$), extends into the body region 44 underneath the source region 46 (i.e., substantially vertically aligned to the source region 46 in the direction Z). The enriched region 48 has the function of reducing, during use, the sheet resistance of the body region 44, which is located under the source region 46 for preventing turning-on of a parasitic bipolar transistor during avalanche multiplication in the breakdown phase.

The elementary cell 61 of FIG. 3A further comprises, according to a further aspect of the present disclosure, a second trench 51, which houses a second trench conductive region 52, for example made of polysilicon with a doping of an N type, and extends through the structural layer 26 and part of the substrate 22, terminating in the substrate 22. More in particular, the second trench 51 extends into the body region 44 through the dielectric layer 28, in an area corresponding to the source region 46 and the enriched region 48. Even more in particular, the second trench 51 reaches a maximum depth, measured along Z starting from the face 26a, equal to the maximum depth reached by the first trench 31.

The second trench conductive region 52, which extends within the second trench 51, is surrounded by one or more dielectric layers (illustrated in FIG. 3A is a single trench dielectric 53, similar to the dielectric 34 of the trench 31).

The second trench 51 extends alongside the gate electrode 30, on the opposite side of the gate electrode 30 with respect to the first trench 31. In other words, the first and second trenches 31, 51 are separated, in top plan view, by the gate electrode 30. The second trench conductive region 52 is electrically insulated from the structural region 26 by the trench dielectric 53. The trench dielectric 53 surrounds the side walls and the bottom of the first trench 51 so that the portion of trench 51 that extends within the substrate 22 and at the interface between the structural region 26 and the substrate 22 is completely filled by the trench dielectric 53. Consequently, the second trench conductive region 52 extends into the second trench 51 until it reaches a maximum depth, measured along Z starting from the face 26a, which is less than the depth, once again measured along Z starting from the face 26a, at which the interface between the structural region 26 and the substrate 22 is located. The second trench conductive region 52 does not fill the second trench 51 completely, but only partially. The second trench 51 is completely filled by a second filling region 56, which extends in electrical contact with the second trench conductive region 52 until it reaches a height, along Z, substantially equal to the maximum height, along Z, reached by the gate electrode 30 (and, thus, substantially equal to the height reached, along Z, by the first filling region 36).

The second filling region 56 is made of conductive material, for example tungsten, in particular tungsten, possibly with the addition of titanium silicide. The second filling region 56 is further electrically insulated from the gate electrode 30 by the spacer 40b.

According to a further embodiment, the lateral spacer 40a and the trench dielectric 34 have a total thickness (i.e., the thickness of the lateral spacer 40a plus the thickness of the trench dielectric 34), measure along a direction parallel to the X axis, which is equal to the respective thickness, measured along the same direction, of the opposite lateral spacer, i.e., lateral spacer 40b. In other words, the first filling region 36 and the second filling region 56 are equally spaced apart, along X, from respectively faced sides 30' of the gate electrode 30.

According to one aspect of the present disclosure, the second filling region 56 is electrically coupled (in particular, by direct electrical contact) with the source region 46 and with the enriched region 48.

A metallization 57 extends over the first and second filling regions 36, 56, electrically coupled thereto. The second metallization 57 is electrically insulated from the gate electrode 30 by the silicon-nitride layer 30d and the dielectric layer 30c, as well as by the spacers 40a, 40b.

In this way, via the second filling region 56, the body region 44 and source region 46 are electrically coupled to the second metallization 57.

During use, according to one embodiment of the present disclosure, the second metallization 57 is biased to a ground reference voltage GND (e.g., 0 V).

A parasitic capacitance $C_{GD}$ is set up between the gate electrode 30 and the drain region 38; this parasitic capacitance $C_{GD}$ is the lower, the more it is possible to decouple the gate electrode 30 electrically from the drain region 38. However, such a solution, which is aimed at reducing the parasitic capacitance $C_{GD}$ presents the disadvantage of increasing the ON-resistance $R_{DS\_ON}$ of the device 60 and likewise increasing the lateral dimensions of the device 60, in the direction X. Consequently, according to one aspect of the present disclosure, the overlapping between the gate electrode 30 and the drain region 38 is chosen of a value such as to keep the ON-resistance $R_{DS\_ON}$ low at the expense of the parasitic capacitance $C_{GD}$ which assumes a relatively high value. By way of example, the extension $d_P$, along X, of the portion of the gate electrode 30 set on top of the drain region 38 may be comprised between approximately 30% and 60%, in particular is 60%, of the extension of the gate electrode 30 measured considering the portion of the gate electrode 30 that faces the structural layer 26 and lies in the plane XY.

The present applicant has found that, using the structure of FIG. 3A to obtain the device 60, the value of ON-resistance $R_{DS\_ON}$ is equal to approximately 3.9 mΩ·mm$^2$ for a voltage of approximately 10 V applied to the gate terminal 30. The gate charge $Q_G$ has a value of approximately 6.6 nC/mm$^2$ for a voltage applied to the gate terminal 30 of approximately 10 V. The present applicant has further found that, even though the value of $Q_G$ has not been optimized, the product $R_{DS\_ON} \cdot Q_G$ is optimized, to the advantage of the value of FOM, which is approximately 25.7 mΩ·nC for a voltage applied to the gate terminal 30 of approximately 10 V.

According to the structure described, the only contributions at the basis of the electrical coupling between the gate electrode 30 and the drain region 38 are: (i) electrical coupling due to the overlapping portion between the drain region 38 and the gate electrode 30, through the insulation layer 28; and (ii) electrical coupling due to the interaction between the side wall 30' of the gate electrode 30 and the drain region 38.

Figure 3B:
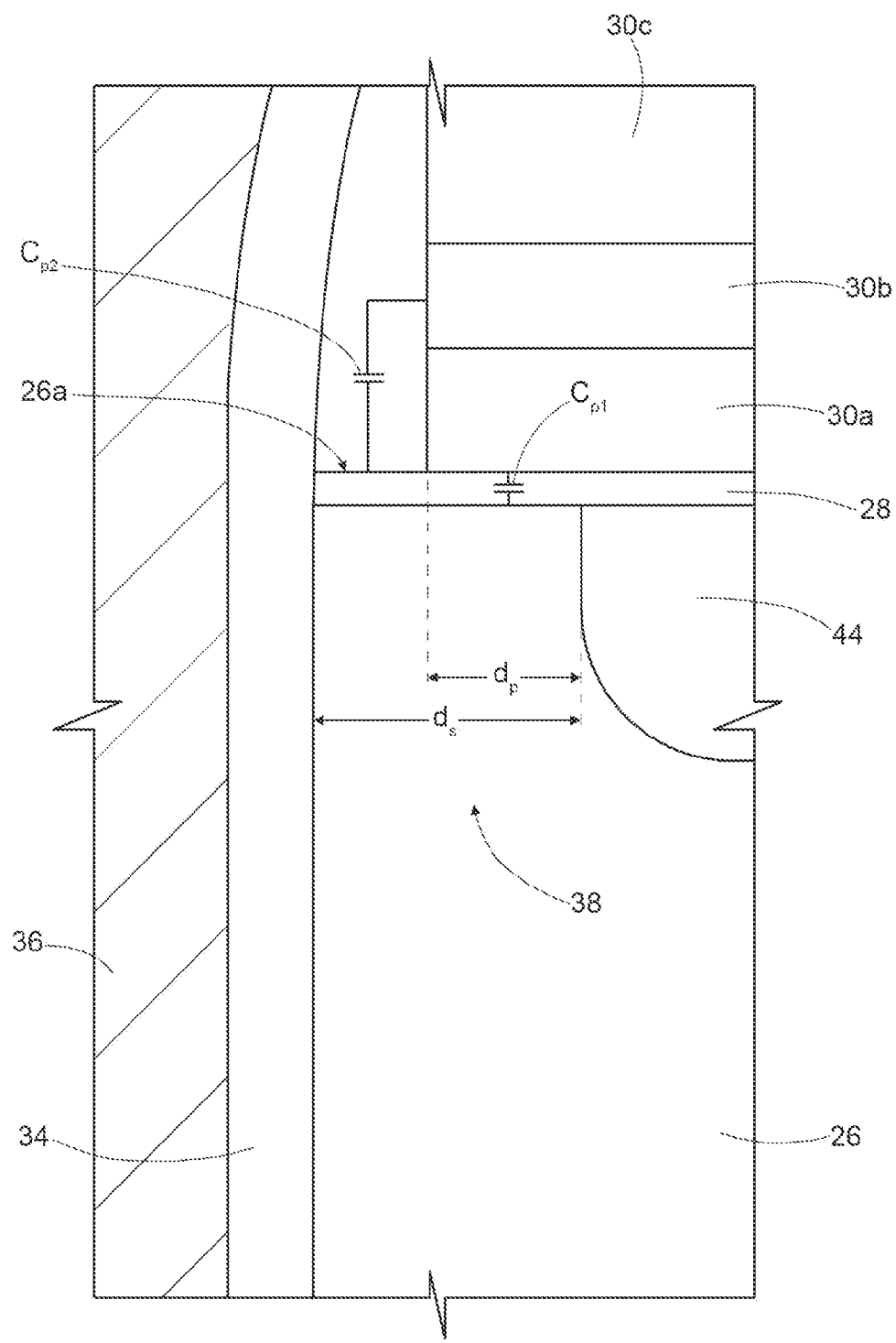
FIG. 3B shows an enlarged detail of the cross section of the power device of FIG. 3A.
Figure 9:
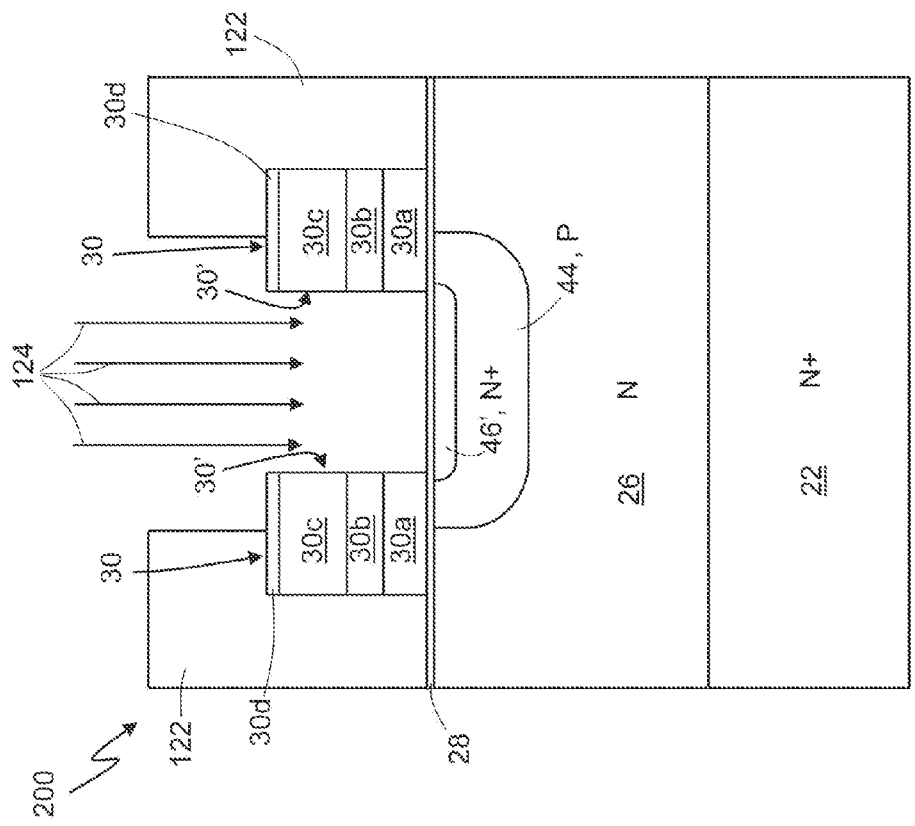
Figure 8:
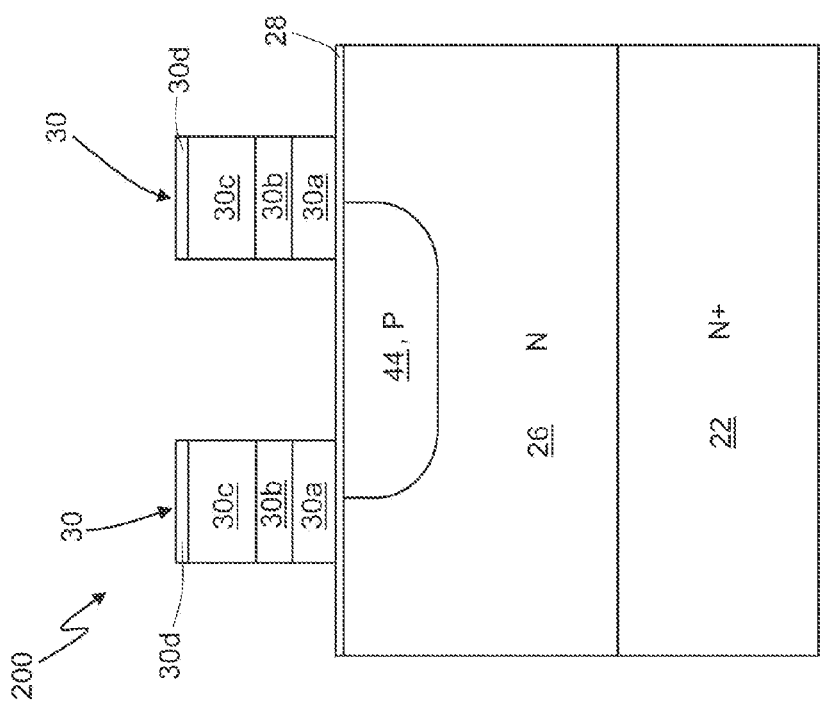
Figure 14:
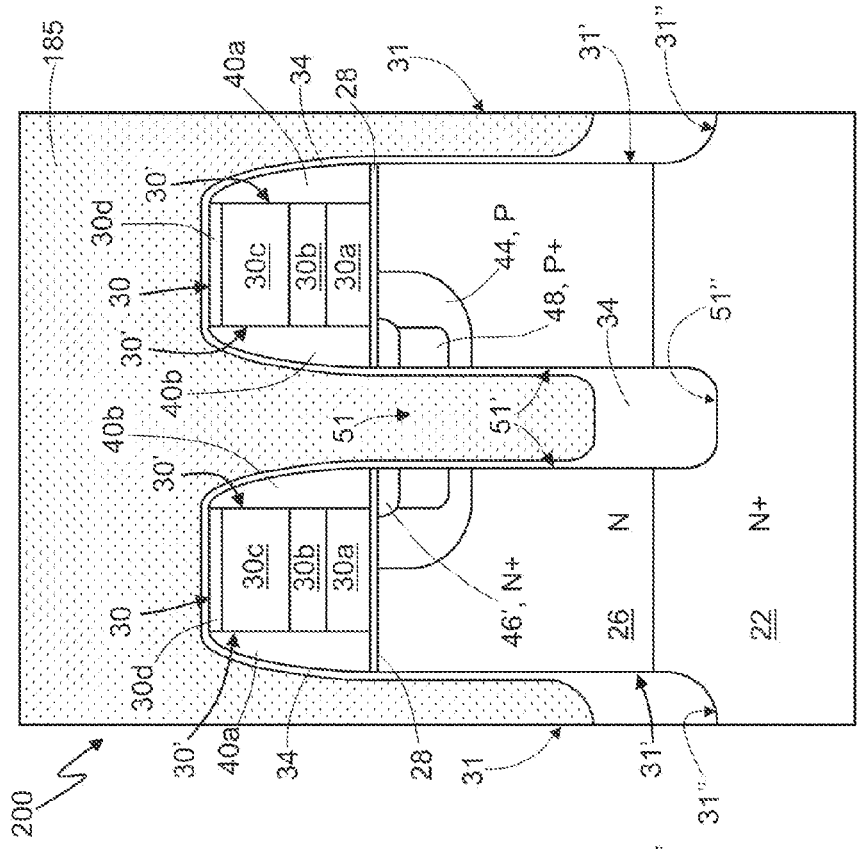
Figure 15:
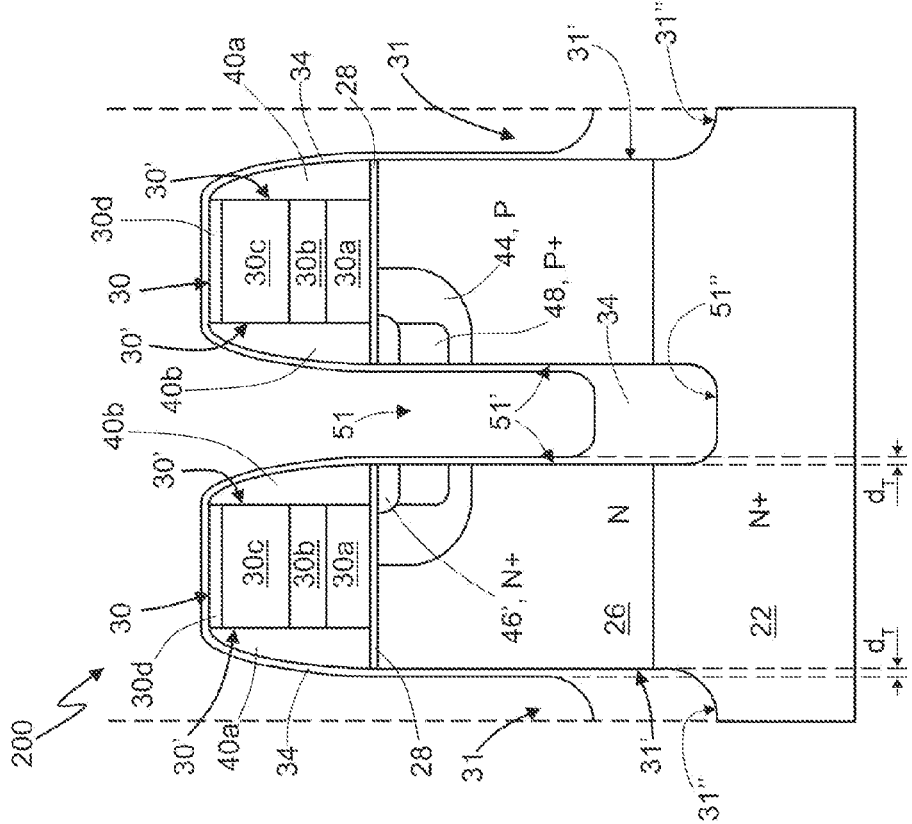

FIG. 3B shows an enlarged detail of the portion of the elementary cell 61 of FIG. 3A that illustrates the parasitic capacitances $C_{P1}$ and $C_{P2}$ at the basis of the aforementioned contributions (i) and, respectively, (ii) of the electrical coupling between gate electrode 30 and drain region 38. It may further be noted that the surface portion of the drain region 38 that interacts with the aforesaid side wall 30' of the gate electrode 30 is the one that extends for a length, along X, equal to that of the base of the spacer 40a.

The power device according to the present disclosure presents the following advantages: the phenomena of hot-carrier injection (HCI) are negligible thanks to the implementation of a superjunction; the specific ON-resistance $R_{DS\_ON}$ has a minimized value; thanks to the reduction of the value of pitch of the elementary cell, the overall dimensions are optimized; further, high versatility is obtained due to the integration of a monolithic half bridge, thanks to the drain terminal on the back.

The first and second trench conductive regions 32, 52 of the trenches 31, 51 have the function of ground shield (when connected to reference voltage GND) for the electric current I that flows through the structural region 26 during use of the device 60. The introduction of a trench with a ground shield in an area corresponding to the source region, together with the presence of the trench 31, enables a pair of shields facing one another for being obtained such as to enable use of high N doping concentrations in the structural region 26, stretching the concept of superjunction. The structural region 26, which has the function of drain region 38 during use, thanks precisely to the presence of the two shields, may be depleted by increasing the drain voltage. The overlapping between the drain region 38 and the gate electrode 30 is chosen with a value such as to minimize the product $R_{DS\_ON} \cdot Q_g$ in favor of the reduction of the ON-resistance $R_{DS\_ON}$. This makes it possible to obtain a device that is fast but at the same time has a reduced ON-resistance $R_{DS\_ON}$ per unit area.

With reference to FIGS. 4-18, manufacturing steps for producing a power device are described. The power device comprises two elementary cells 61 of the type illustrated in FIG. 3A. The manufacturing steps described hereinafter may be used for producing a power device including any plurality of elementary cells greater than two.

With reference to FIG. 4, a wafer 200 is provided, including the substrate 22, made of semiconductor material, for example silicon, having the first conductivity of an N type and with a doping concentration equal to, or greater than, $1 \cdot 10^{19}$ cm$^{-3}$, and a resistivity comprised between 1 mΩ·cm and 5 mΩ·cm.

The substrate 22 has the first side 22a and the second side 22b opposite to one another and substantially orthogonal to the direction Z. Formed on the first side 22a is the structural region 26, for example by epitaxial growth of silicon. The structural region 26 has, according to the present disclosure, the first conductivity (of an N type) with a doping concentration comprised between approximately $5 \cdot 10^{16}$ ions/cm$^3$ and $1 \cdot 10^{17}$ ions/cm$^3$. Doping of the structural region 26 is obtained by introducing appropriate dopant species in the reaction chamber during the epitaxial growth. Alternatively, doping of the structural region 26 is obtained by implantation of dopant species at the end of, or during, formation of the structural region 26, in a per se known manner. For example, the doping of an N type is obtained using ions of arsenic or phosphorus.

This is followed by formation of the dielectric layer 28, for example of silicon oxide $SiO_2$. The dielectric layer 28 is formed, for instance, by thermal oxidation of the structural region 26, or by deposition of dielectric material. The dielectric layer 28 has a thickness comprised between 30 nm and 60 nm.

This is followed by formation of the stack of layers set on top of one another, which, in the subsequent manufacturing steps, form one or more gate electrodes 30. For this purpose, formed by deposition on the dielectric layer 28 is a first intermediate layer 30a of doped polysilicon, in particular of an N type, having a thickness comprised between 300 nm and 400 nm. Then, formed on the first intermediate layer 30a is a second intermediate layer 30b, for example of silicide (formed in a per se known manner, with a process of thermal reaction) or of deposited metal. The second intermediate layer 30b has a thickness comprised between 100 nm and 200 nm. The first intermediate layer 30a is the gate electrode proper, whereas the layer 30b has the function of metal electrode.

Next, formed on the second intermediate layer 30b is a third intermediate layer 30c, of dielectric material, for example obtained by deposition of silicon oxide $SiO_2$. The third intermediate layer 30c has, for example, a thickness comprised between 300 nm and 400 nm.

Then, formed on the third intermediate layer 30c is a fourth intermediate layer 30d, for example of deposited silicon nitride. The fourth intermediate layer 30d has, for example, a thickness comprised between 70 nm and 140 nm and the function of etch-stop layer during subsequent etching steps for definition of the insulating layer 34.

This is followed by definition, via masked etching, of gate electrodes 30. With reference to FIG. 5, a photoresist mask 112 is formed on the wafer 200, designed to protect regions of the wafer 200 where gate electrodes 30 are to be formed. This is followed by one or more etches (represented, by way of example, by arrows 114 in FIG. 10) for selective removal of the fourth, third, second, and first intermediate layers 30d-30a in regions of the wafer 200 not protected by the mask 112. The etches of FIG. 5 include etches of a dry type with etching chemistries that may be chosen according to the materials to be removed and that typically vary according to the layer for being etched.

Then (FIG. 6), the mask 112 is removed from the wafer 200 to obtain gate electrodes 30 (two gate electrodes 30 are represented in FIG. 6). The gate electrodes 30 are separated from one another by a distance $d_1$, measured in the direction X, comprised between approximately 0.6 µm and approximately 0.8 µm.

Then (FIG. 7), the body region 44 is formed. For this purpose, a mask 116 is formed on the wafer 200, for example a photoresist mask designed to protect the wafer 200 except for regions of the latter comprised between gate electrodes 30 facing one another in the direction X. Then, a step of implantation is carried out of dopant species having the second conductivity (of a P type), for example boron, as represented by the arrows 118 in FIG. 7. The implantation is performed with an implantation energy of approximately 30-50 keV, which in any case may be modulated on the basis of the thickness of the dielectric layer 28 and of the desired implantation depth. An implanted region 43 is thus formed in the structural region 26 having a lateral extension (along X) substantially equal to the distance $d_1$ (once again measured along X) existing between the side walls 30', which belong to different gate electrodes 30 and directly face one another.

This is followed (FIG. 8) by a step of rapid thermal annealing (RTA), at a temperature of between 1000° C. and 1100° C. for a time comprised between approximately 30 s and 60 s, which enables diffusion of the implanted region 43 to form the body region 44. The body region 44 extends, in top plan view, between the gate electrodes 30 and underneath the gate electrodes 30.

Next (FIG. 9), formed on the wafer 200 is a photoresist mask 122 having an extension similar to the mask 116 of FIG. 7. The mask 122 covers the wafer 200 except for the regions of the latter comprised between walls 30' of respective gate electrodes 30 directly facing one another in order to form source regions. Thus, an implantation is made—represented by arrows 124—of dopant species (for example, arsenic or phosphorus) having the first type of conductivity (N), with an implantation energy of approximately 60-140 keV, to form an intermediate source region 46' facing the first side 26a of the structural region 26 and completely surrounded, on the remaining sides, by the body region 44.

Then (FIG. 10), using the same mask 122, a further implantation of dopant species is made (for example, boron) having the second conductivity (of a P type) with an implantation energy of approximately 80-140 keV, and with an ion-implantation dose of approximately $1 \cdot 10^{14}$ cm$^{-2}$. This step is represented in FIG. 10 by arrows 126. An implanted region is thus formed, that constitutes the enrichment region 48.

In alternative embodiments, the enrichment region 48 may be obtained with an implantation made after formation of the spacers 40a and 40b (described with reference to FIGS. 11 and 12).

The implantation energy chosen during the step of FIG. 10 is such as to obtain an implanted region 48 within the body region 44 but extending to a depth greater than the depth of the intermediate source region 46' so that the implanted region 48 is separated from the top side 26a of the structural region 26 by the intermediate source region 46'.

Then (FIG. 11), a step of deposition is carried out, for example using the LPCVD or PECVD technique, of dielectric material on the wafer 200, for example silicon oxide SiO$_2$, with a thickness comprised between 100 nm and 500 nm, in particular between 100 and 200 nm. A covering dielectric layer 128 is thus formed, which covers the gate electrodes 30 and the dielectric layer 28. Next (FIG. 12), the covering dielectric layer 128 is etched by an anisotropic dry etch, for instance using a dry etch with etching chemistry CF$_4$/CHF$_3$/Ar (HDP plasma) or else C$_2$F$_6$/CHF$_3$/He (RIE plasma).

This etching step is carried out for removing the covering dielectric layer 128 completely from the wafer 200 except for portions of the covering dielectric layer 128 adjacent to the side walls 30' of the gate electrodes 30. Furthermore, this etching step is continued until portions of the dielectric layer 28 are removed that extend underneath the covering dielectric layer 128, where the latter has been completely removed. The anisotropic dry etch is such that the covering dielectric layer 128 is removed at a higher rate in portions of the latter orthogonal to the etching direction (i.e., in particular, orthogonal to Z), whereas portions of the covering dielectric layer 128 substantially longitudinal to the etching direction (for example, the portions of the covering dielectric layer 128 extending along the side walls 30' of the gate electrodes 30) are removed at a lower rate. There are thus formed, along the side walls 30' of the gate electrodes 30, spacers 40a and 40b having an ideally triangular shape, or a shape tapered along Z such that the lateral thickness, measured along X, of the spacers 40a, 40b, decreases the further the distance along Z from the top side 26a of the structural region 26. In particular, the spacers 40a, 40b have a base side having a dimension, measured along X, approximately equal to the thickness chosen for the covering dielectric layer 128 (e.g., between 100 and 200 nm).

Furthermore, the spacers 40a, 40b protect, during the previous etching step, portions of the dielectric layer 28, which is not removed, that extend underneath them.

This is followed by formation of deep trenches 31 (FIG. 13), which extend completely through the structural region 26 and through part of the substrate 22 alongside the gate electrodes 30, and a deep trench 51, which extends completely through the structural region 26 and through part of the substrate 22 between the gate electrodes 30. The trench 51 defines two source regions 46 deriving from the separation of the intermediate source region 46'; in other words, the source regions 46 are separated from one another by the trench 51.

The trenches 51, 31 are formed by anisotropic etching of the structural region 26 and of the substrate 22.

According to one embodiment, an etch of a DRIE type is used.

The spacers 40a and 40b, laterally adjacent to the gate electrodes 30, function as alignment masks for the trenches 51, 31 such that the trenches 51, 31 have a respective portion of the respective internal wall 51', 31' vertically aligned (along Z) with a portion of the respective spacers 40a, 40b.

Then (FIG. 14), the wafer 200 is subjected to a step of deposition of dielectric material, for example silicon oxide or silicon nitride. In this step, a dielectric layer 34 is formed on the wafer 200, in particular on the respective internal walls 51', 31' of the trenches 51, 31, at the bottom 51", 31" of the trenches 51, 31, and on the gate electrodes 30. This dielectric layer 34 has a minimum thickness d$_T$, measured on the side walls 51', 31' of the trenches 51, 31, comprised between approximately 60 nm and 100 nm, for example 60 nm. At the bottom 51", 31" of the trenches 51, 31, instead, the dielectric layer 34 has a larger thickness, for example comprised between approximately 200 nm and 600 nm, in particular 400 nm. In general, the thickness of the dielectric layer 34 at the bottom 51", 31" of the trenches 51, 31 is such as for being greater, along Z, than the extension, along Z, of the respective trenches 51, 31 within the substrate 22. In other words, the portion of the trenches 51, 31 that extends within the substrate 22 is completely filled by the dielectric layer 34.

This profile may be obtained in a way known to the person skilled in the art, for example using a liquid-phase-deposition (LPD) process, or else the process described in US Patent Publication No. 2014/0197487, filed in the name of STMicroelectronics S.r.l., where a method is described for forming a trench dielectric having a thickness, measured in the direction X starting from the wall of the respective trench, that varies when measured at depths (along Z) different from one another. In particular, this thickness has a minimum value when measured substantially on the first side 26a of the structural region 26 and as far as an intermediate depth, and a maximum value at a greater depth until the bottom end of the trench is reached.

This is followed by a step of deposition (FIG. 15) on the wafer 200—and thus also into the trenches 51, 31—of a first conductive material 185, in particular doped polysilicon of an N type. The first conductive material 185 is deposited until it fills the trench 51, 31 completely and covers the gate electrodes 30 completely.

This is followed by a partial etching (FIG. 16) of the first conductive material 185, using a selective etching chemistry that removes the first conductive material 185 but not the underlying dielectric layer 34 for removing completely the first conductive material 185 that covers the gate electrodes 30 and remove partially the first conductive material 185 from the trenches 51, 31. Thus, in this step, the trenches 51, 31 remain partially filled with the first conductive material 185. Partial filling of the trenches 51, 31 with the first conductive material 185 is such that the first conductive material 185 reaches, along Z, a level comprised between the minimum and the maximum extension, once again along Z, of the enriched region 48. The first conductive material 185 thus forms, in the trenches 31, respective first trench conductive regions 32 and, in the trench 51, the second trench conductive region 52.

Then (FIG. 17), a subsequent masked-etching step enables partial removal of the dielectric layer 34 from the wafer 200, except for regions thereof protected by a mask 145. The mask 145, for example a photoresist mask, is formed over an area corresponding to the trenches 31 and protects the wafer 200 except for the surface portion of the latter extending between the gate electrodes 30, i.e., over the trench 51. In addition, portions of the gate electrodes 30 close to the spacers 40b and 40b facing the trench 51 are not protected either by the mask 145. The step of etching of the wafer 200 enables removal of part of the dielectric layer 34 that extends over the gate electrodes 30 not protected by the mask 145, above the spacers 40b facing the trench 51, and along the side wall of the trench 51 not covered by the first conductive material 185. In this way, lateral portions of the source regions 46 and part of the enriched region 48 (i.e., the portion of the latter not covered by the first conductive material 185) are exposed.

The first and second conductive regions 32 and 52 are thus obtained in the trenches 31 and 51, respectively, according to what is illustrated in FIG. 3A.

Figure 18:
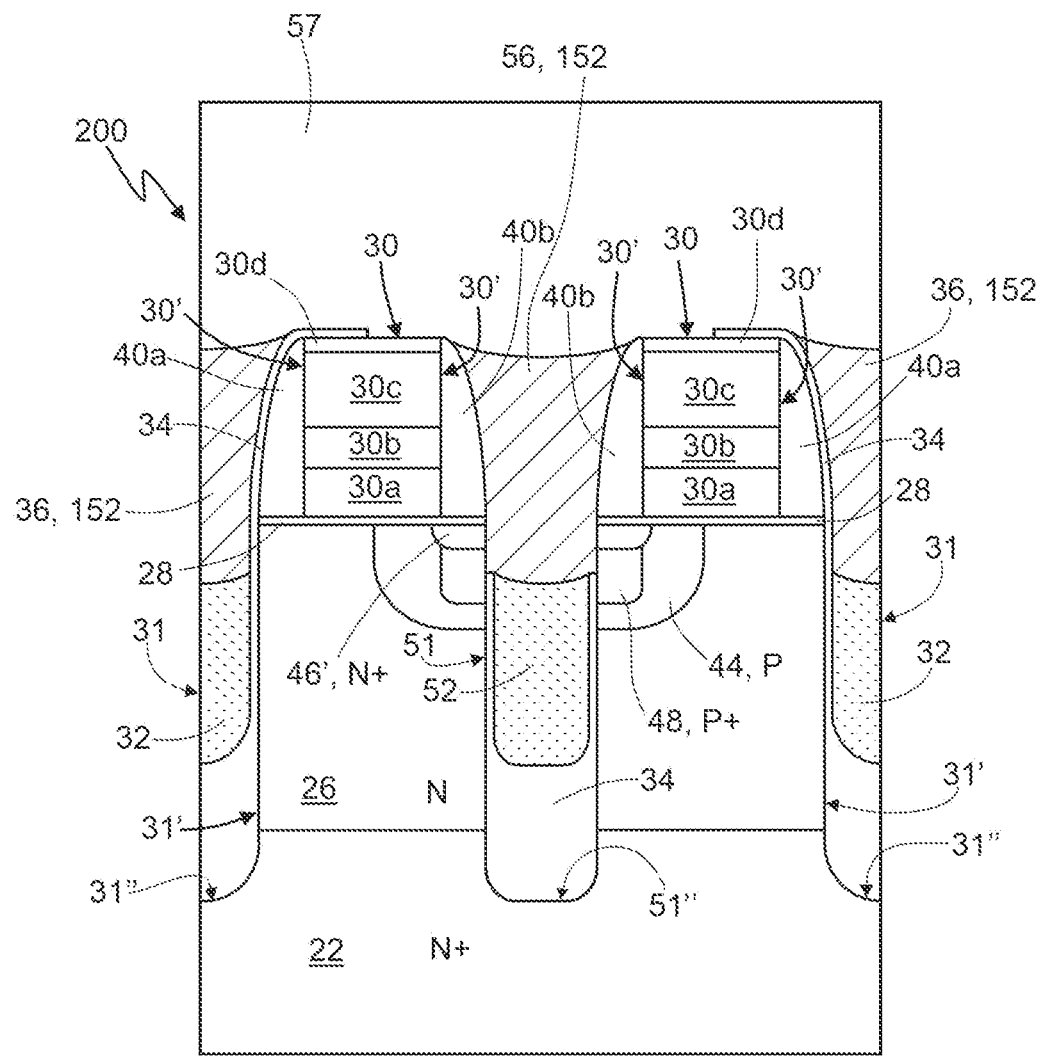

With reference to FIG. 18, the trenches 51 and 31 are filled with a second conductive material 152, for example metal, such as tungsten and possibly titanium silicide. The second conductive material 152 is deposited for filling the trenches 51, 31 completely, likewise extending along the spacers 40b until it reaches a height, along Z, substantially equal to the height reached, once again along Z, by the gate electrodes 30.

The second conductive material 152 is electrically coupled to the first and second trench conductive regions 32, 52 formed by the previous steps of processing of the first conductive material 185. Furthermore, with reference to the trench 51, the second conductive material 152 is likewise in direct electrical contact with the lateral portions, which have previously been exposed, of the source regions 46 and of the enriched regions 48.

Any residue of the second conductive material 152 above the gate electrodes 30 is removed by an etching step of a known type.

The second filling regions 36 and 56 of the trenches 31 and 51, respectively, are thus provided, according to what is illustrated in FIG. 3A.

Then (once again with reference to FIG. 18), the source metallization 57 is formed by depositing conductive material, in particular metal, on the wafer 200, in particular in electrical contact with the first and second filling regions 36, 56. In addition, a further step of deposition of conductive material, in particular metal, on the back of the wafer 200 (on the second side 22b of the substrate 22) enables formation of the drain metallization 41.

Figure 19:
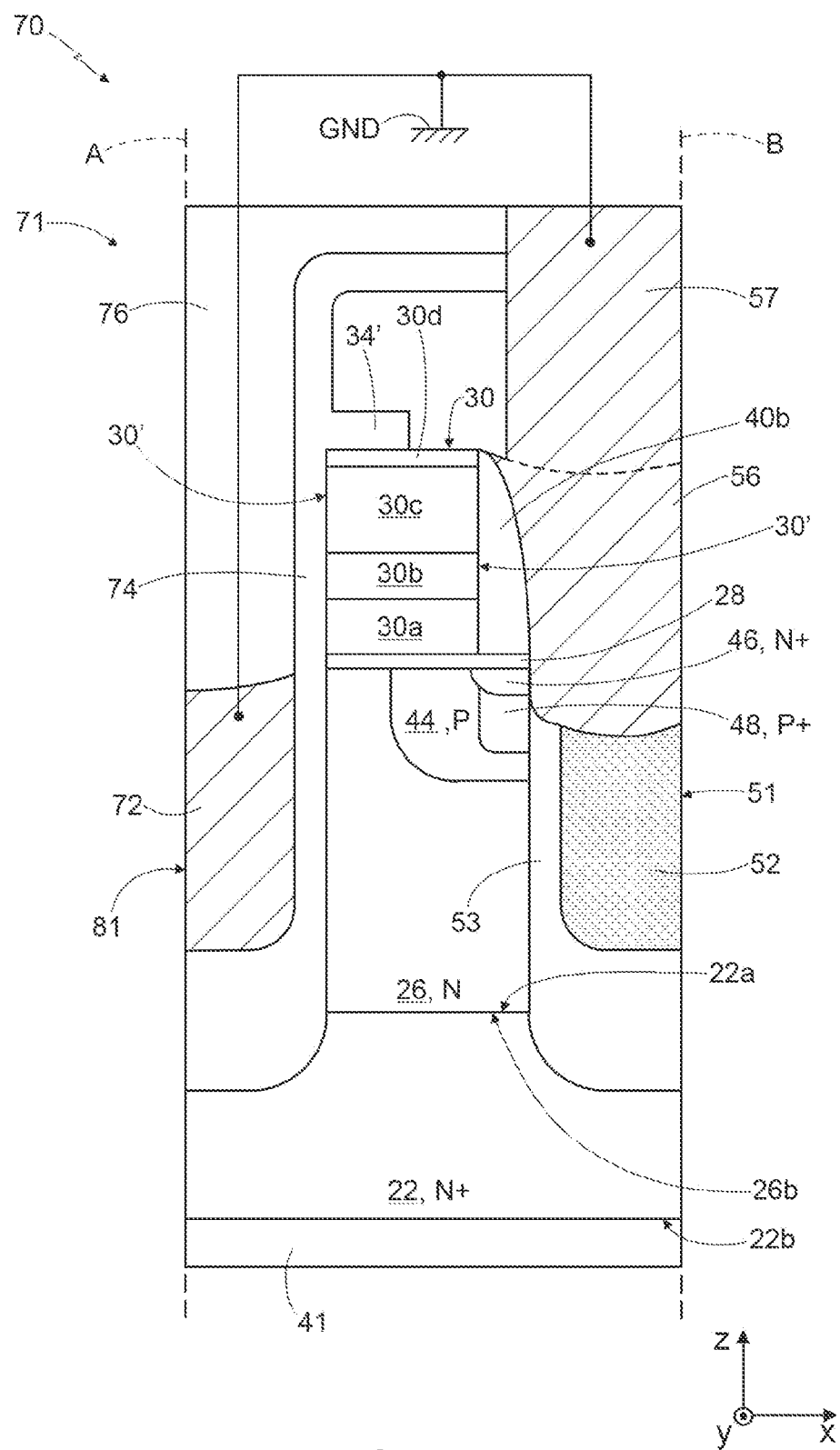
FIG. 19 shows, in lateral sectional view, an elementary cell of a power device according to a further embodiment of the present disclosure.

FIG. 19 shows a device 70 according to a further embodiment of the present disclosure. FIG. 19 shows a single elementary cell 71, in a way similar to what is illustrated in FIG. 3A. Elements of the device 60 of FIG. 3A that are in common with the device 70 of FIG. 19 are designated by the same reference numbers and not described any further. According to this embodiment, a trench 81 is present instead of the trench 31 of the device 60. The trench 81 comprises a dielectric or insulating layer 74 substantially similar to the corresponding dielectric layer 34 of the trench 31, designed to cover the walls and the bottom of the trench 81. However, in the case of the device 70, the spacer 40a is not present, and the trench 81 extends in depth in the structural region 26 and in part of the substrate 22 substantially aligned, along Z, with the side wall 30' without the spacer 40a. Also the dielectric layer 74 thus extends in direct contact with the side wall 30' without the spacer 40a.

Furthermore, the trench 81 of the device 70 houses a trench conductive region 72, made, for example, of conductive material such as tungsten (or some other conductive material that may be used as filling material), which extends into contact with the dielectric layer 74 and is designed to fill the trench 81 completely until a height is reached, along Z, substantially corresponding to the height, once again along Z, of the face 26a of the structural region 26.

Possibly, the trench conductive region 72 may reach beyond, along Z, the face 26a of the structural region 26, extending up to a level equal to the level reached, once again along Z, by the dielectric 28 or slightly higher. Preferably, the trench conductive region 72 does not extend laterally facing the gate electrode 30 for the entire extension of the side wall 30'.

In addition, the device 70 comprises a single spacer 40b, i.e., the spacer set above the source region 46 on the respective side wall 30' of the gate electrode 30. As has been said, extending on the opposite side wall 30' is the layer of dielectric material 74 designed to guarantee complete electrical insulation between the gate electrode 30 and the trench conductive region 72 in the case where the latter were to extend, in part, beyond the dielectric 28, alongside the gate electrode 30.

Present above the trench conductive region 72 is a dielectric filling layer 76, made, for example, of silicon oxide or silicon nitride, which also covers the gate electrode 30.

The metallization 57 extends, in the case of the device 70, substantially aligned to, and electrically coupled with, the filling region 56 of the trench 51, but electrically insulated from the trench conductive region 72 of the trench 81.

The trench conductive region 72 is coupled to the reference terminal GND, in a way not illustrated in the figures. In particular, the connection between the trench conductive region 72 and the reference terminal GND is provided at a distance from the gate electrode 30, for example in a peripheral region of the chip that houses the device 70.

There is thus obtained a compact structure, with consequent benefit as regards ON-resistance $R_{DS\_ON}$ per unit area, and a better superjunction effect.

FIGS. 20-27 show manufacturing steps for producing the device 70 of FIG. 19.

Figures 20, 21:
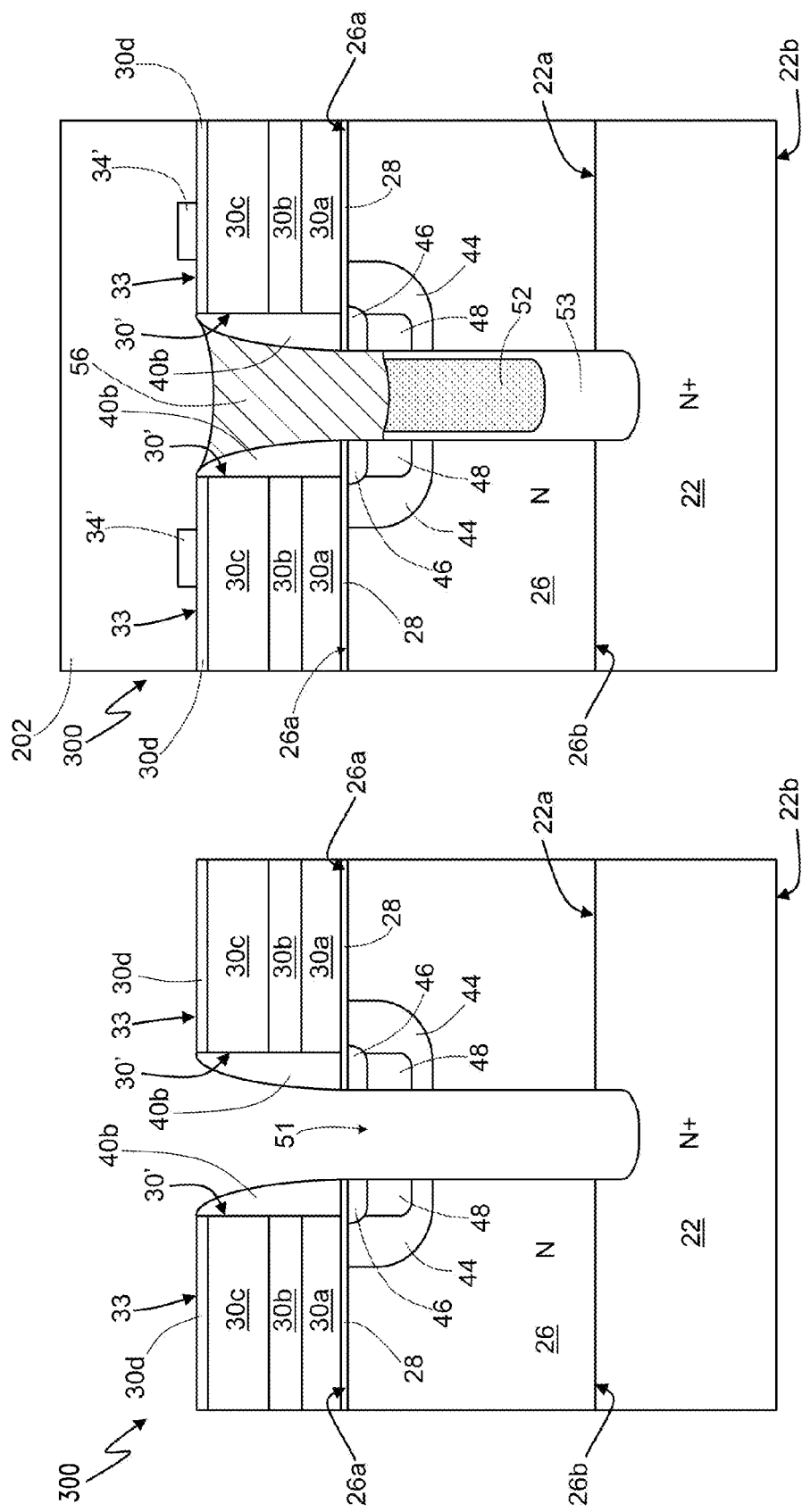

FIG. 20 shows a wafer 300 in an intermediate manufacturing step, i.e., a wafer that has undergone previous processing.

The wafer 300 of FIG. 20 has been processed following manufacturing steps substantially similar to the ones described with reference to FIGS. 4-11. However, in this case, the gate electrodes 30 have not been defined on all the sides, but only on the respective side 30' that faces the second trench 51 (in what follows these will be identified as "intermediate gate electrodes" 33). As may be noted from FIG. 20, the opposite side has not been defined and extends throughout the extension of the portion of the wafer 300 illustrated in FIG. 20. Complete definition of the gate electrodes 30 is carried out in subsequent processing steps.

Thus, with reference to FIG. 20, a first step of etching of the wafer 300 is carried out to form just the spacers 40b (as described with reference to FIG. 12).

Once again with reference to FIG. 20, this is followed by an etching step to form the trench 51.

This step is similar to the one described with reference to FIG. 13 for formation of the same trench 51.

Then (FIG. 21), steps are carried out for formation of the trench dielectric 53, of the second trench conductive region 52, and of the filling region 56 in a way similar to what has already been described, for the trench 51, with reference to FIGS. 13-18. It should be noted that the step of formation of the dielectric layer 34 (by deposition of dielectric material) leads to formation of a dielectric layer also over the intermediate gate electrodes 33. As described with reference to FIG. 17, the step of selective etching of the dielectric layer 53 inside the trench 51 is carried out using a mask similar to the mask 145 of FIG. 17, which partially covers the intermediate gate electrodes 33. Consequently, portions 34' of dielectric material remain above the intermediate gate electrodes 33, in so far as they are protected by the mask.

This is followed by a step of deposition of a dielectric layer 202, for example silicon oxide or silicon nitride, on the wafer 300, to cover the intermediate gate electrodes 33 and the second filling region 56.

Then steps of formation (FIG. 22) of the trenches 81 of FIG. 19 are carried out.

According to an embodiment (illustrated in FIG. 22), a mask 204, e.g., a photoresist mask, which is designed to cover the dielectric layer 202 is formed, in a region thereof set on top of the trench 51, of the spacers 40b, and of a portion of the intermediate gate electrodes 33 that is contiguous to the spacers 40b. It should be noted that the remaining portion of the intermediate gate electrodes 33 is not protected by the mask 204. The non-protected portion of the intermediate gate electrodes 33 is approximately 10-30% of the extension along X of the respective intermediate gate electrode 33.

Then (FIG. 23), a plurality of etches are carried out for removing selectively, in succession, the portions not protected by the mask 204 of the dielectric layer 202, of the dielectrics 34', of the intermediate gate electrodes 33, of the dielectric 28, of the structural region 26, and of part of the substrate 22. Trenches 81 are thus formed that extend in depth through the structural region 26 and part of the substrate 22, and terminate in the substrate 22. In this step, the gate electrodes 30 are likewise defined, having an extension in the plane XY similar to that of the gate electrodes 30 of FIG. 3A. The trenches 81 are aligned, along Z, to the respective gate electrodes 30, as a result of the mask 204.

Figures 24, 25:
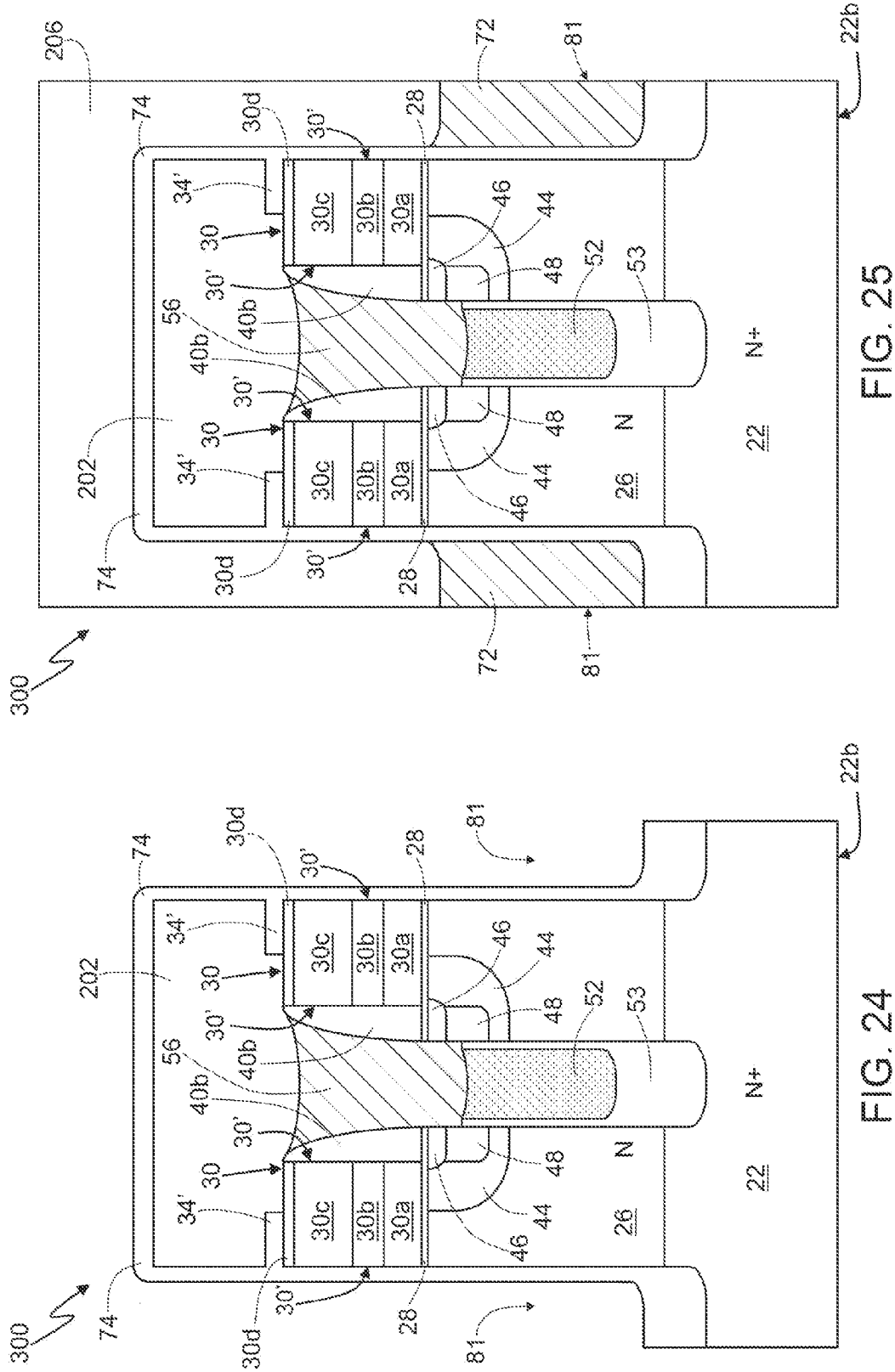

With reference to FIG. 24, after removal of the mask 204 a step of deposition of dielectric material on the wafer 300 and in the trenches 81 is carried out to form the dielectric layer 74 that covers the side walls and the bottom of the trenches 81. The dielectric layer 74 likewise covers the dielectric layer 202, as well as the side walls 30' of the gate electrodes 30 exposed during the previous etching step. The minimum thickness of the dielectric 74 on the side walls of the trenches 81 is approximately 60 nm, whereas on the bottom of the trenches 81 it has a larger thickness, for example between 200 nm and 600 nm. The thickness (along Z) of the dielectric 74 on the bottom of the trenches 81 is such as for being equal to, or greater than, the extension (along Z) of the portion of the respective internal trench 81 of the substrate 22. In any case, the dielectric 34 that covers the bottom of the trenches 81 does not extend beyond half of the thickness of the structural region 26.

This is followed by a step (FIG. 25) of deposition of conductive material, for example tungsten, within the trenches 81, for filling the trenches 81 until a height, along Z, is reached substantially equal to the height reached, once again along Z, by the top face 26a of the structural region 26. The trench conductive regions 72 of FIG. 19 are thus formed. A further step of deposition of dielectric material, e.g., silicon oxide or silicon nitride, on the wafer 300 enables formation of an insulation layer 206 for electrical insulation of the trench conductive region 72.

Next (FIG. 26), the insulation layer 206, the dielectric layer 202, and the dielectric layer 74 are selectively removed only in the second filling region 56 of the trench 51 to form an opening 208 for access to the second filling region 56.

A step of deposition of conductive material, for example tungsten, is then carried out (FIG. 27), for filling the opening 208 to form a conductive connection 210 between the second filling region 56 and the surface of the wafer 300. Finally, it is possible to deposit a metallization layer for providing the second metallization 57, in direct electrical contact with the conductive connection 210 and, via this, with the second filling region 56 and the second trench conductive region 52. Also the back metallization 41 is further provided, thus obtaining the device 70 of FIG. 19.

The trench conductive region 72 is coupled to the reference terminal GND, in a way not illustrated in the figure. In particular, the connection between the trench conductive region 72 and the reference terminal GND is not provided for each trench conductive region 72 alongside the gate electrode 30, but in a region of the wafer 300 located at a distance from the gate electrode 30, for example in a peripheral region of the wafer 300. Furthermore, according to an embodiment, a plurality of trench conductive regions are coupled to the reference terminal GND through a common metal connection.

Figure 28A:
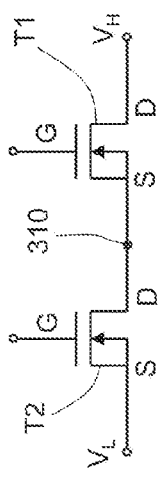
FIG. 28a shows a circuit diagram of a half-bridge block including two transistors coupled to one another through a common terminal.
Figure 28B:
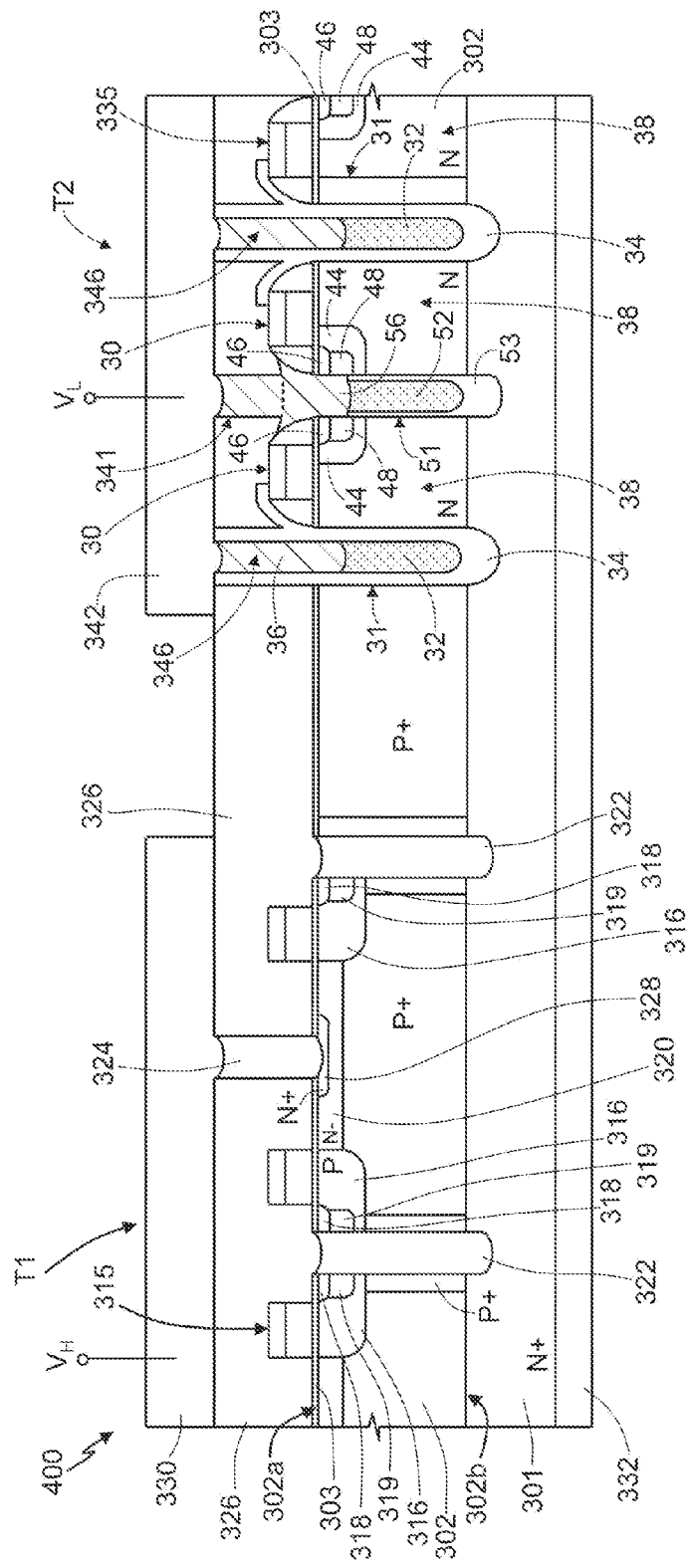
FIG. 28b shows, in lateral sectional view, an embodiment of the half-bridge block of FIG. 28a, where one of the transistors is provided according to any one of the embodiments of the present disclosure.

FIG. 28a shows a circuit diagram of a half-bridge block obtained by two MOSFETs; FIG. 28b shows, in cross-sectional view, a wafer 400 including a monolithic block of MOSFETs that form the half-bridge block of FIG. 28a.

With reference to FIG. 28a, a first transistor T1 of an N type is present, as well as a second transistor T2, which is also of an N type, each having a respective drain electrode D, source electrode S, and gate electrode G.

The drain electrode D of the transistor T1 ("high-side transistor") may be biased, in use, to a voltage $V_H$, whereas the source electrode S of the transistor T2 ("low-side transistor") may be biased, in use, to a voltage $V_L$, with $V_H > V_L$. For example, the voltage $V_L$ is equal to the ground reference voltage GND. The source electrode of the transistor T1 is electrically coupled to the drain electrode of the transistor T2 at a common node 310.

With reference to FIG. 28b, the transistor T1 is set on the left of the section shown, whereas the transistor T2 is set on the right of the section shown.

The wafer 400 comprises a substrate 301 made of semiconductor material, for example silicon, and a structural region 302, made, for example, of epitaxially grown silicon. The structural region 302 has a top side 302a and a bottom side 302b, where the bottom side 302b is in contact with the substrate 301.

With reference to the transistor T1, this is obtained using a substrate 301 having a doping of an N+ type and a structural region of epitaxially grown silicon having a doping of an P type. The transistor T1 includes: gate electrodes 315 arranged above the top side 302a of the structural region 302 and separated from the latter by a gate-dielectric layer 303; body regions 316, of a P type, formed in the structural region 302 and facing the top side 302a of the structural region 302; source regions 318, of an N− type, formed in the structural region 302, within the body regions 316, and facing the top side 302a of the structural region 302; p-wells 319, of a P+ type, formed in the structural region 302, within the body regions 316, underneath the source regions 318; and drain regions 320, extending into the structural region 302, facing the top side 302a of the structural region 302, between body regions 316. One or more plugs 322 made of electrically conductive material, for example metal, extend through the structural region 302 starting from the top side 302a until they reach the substrate 301, terminating within the substrate 301. The plugs 322 are in electrical contact with respective source regions 318 and have the function of forming an electrical connection between the source regions 318 and the substrate 301.

Extending over the structural region 302 and the gate electrodes 315 is a dielectric layer 326, for example of silicon oxide, as a protection and insulation of the gate electrodes and of the plugs 322. A further conductive plug 324 extends through the dielectric layer 326 and the gate oxide 303 until it reaches and electrically contacts the drain region 320. To favor this electrical contact, the drain region 320 locally has a region of electrical contact 328 having an N+ doping greater than the doping of the drain region 320.

A metallization 330 extends over the wafer 400, on the dielectric layer 326, in electrical contact with the plug 324, to form a drain electrode D of the transistor T1. A metallization 332 extends over the back of the wafer 400, in electrical contact with the substrate 301 and with the source regions 318 (via the substrate 301 and the plugs 322). The metallization 332 concurs in forming a source electrode for the transistor T1.

The transistor T2 is a power device according to any one of the embodiments described with reference to FIGS. 3A and 19 and obtained according to the manufacturing steps described previously.

In an area corresponding to the transistor T2, the structural region 302 is similar to the structural region 26 described previously. Thus, the structural region 302, in the portions of the wafer 400 where the devices T2 are formed, has a doping of an N type, with concentration of dopants comprised between $5 \cdot 10^{16}$ and $1 \cdot 10^{17}$ ions/cm$^3$. The transistor T2 includes: the gate electrodes 30 set on the top side 302a of the structural region 302 and separated from the latter by the gate-dielectric layer 303; body regions 44, formed in the structural region 302 and set facing the top side 302a of the structural region 302; source regions 46 formed in the structural region 302, within the body regions 44, and set facing the top side 302a of the structural region 302; and p-wells 48 formed in the structural region 302, within the body regions 44, underneath the source regions 46. The portions of the structural layer 302 with doping of an N type, external to, and surrounding, the body regions 44, form, as has already been said, drain regions 38.

A conductive plug 341 extends through the dielectric layer 326 until it reaches and electrically contacts the filling region 56 of the trench 51. In a similar way, respective conductive plugs 346 are formed through the dielectric layer 326 in positions corresponding TO the trenches 31 for electrically contacting the respective filling regions 36. The plugs 341 and 346 are, for example, made of the same material (e.g., tungsten) of which the filling regions 36 and 56 are made. A metallization 342 extends over the wafer 400, on the dielectric layer 326, in electrical contact with the plugs 341 and 346, to form a source electrode S of the transistor T2. The metallizations 330 of the transistor T1 and the metallizations 342 of the transistor T2 are electrically insulated from one another.

The drain regions 38 of the transistor T2 are in electrical contact with the substrate 301 and with the metallizations 332. Consequently, the source regions 318 of the transistor T1 and the drain regions 38 of the transistor T2 are electrically coupled to one another. The metallizations 332 and the substrate 301 form the common node 310 of FIG. 28a.

From an examination of the characteristics of the disclosure obtained according to the present disclosure, the advantages that it affords are evident.

The horizontal dimensions (measured along X), or pitch, of a power device according to any one of the embodiments of the present disclosure are considerably smaller than those of the known art; the drain electrode is provided on the back of the wafer, enabling a packaging of a standard type; the performance is not impaired, and is comparable to that of horizontal-channel LDMOS devices of a known type.

The low drain-to-source ON-resistance $R_{DS\_ON}$ enables good values in terms of FOM for being obtained.

Finally, it is clear that modifications and variations may be made to what has been described and illustrated herein, without thereby departing from the scope of the present disclosure.

In particular, according to a further embodiment (not shown), the first trench conductive region 32, and/or the second trench conductive region 52, and/or the conductive region 72 extend in depth, in the direction Z, until they reach a depth in the direction Z equal to the depth, once again in the direction Z, at which the interface between the structural region 26 and the substrate 22 is located.

According to a further embodiment, the first trench conductive region 32, and/or the second trench conductive region 52, and/or the conductive region 72 extend in depth, in the direction Z, until they reach a depth in the direction Z greater than the depth, once again in the direction Z, at which the interface between the structural region 26 and the substrate 22 is located.

In addition, according to further embodiments, the trench dielectric 34, and/or the trench dielectric 53, and/or the trench dielectric 74 have, on the bottom of the respective trench 31, 51, 81, the same thickness that they assume on the side wall of the respective trench 31, 51, 81.

Further, according to a further embodiment of the present disclosure, the structural region 26 has a doping of a P type. In this case, the electronic device has a drain region formed by a masked angled implantation of dopant species of an N type in the structural region 26 for forming implanted drain regions extending adjacent to walls of the first trench 31. The implantation is performed immediately after the step of FIG. 13 (or the step of FIG. 23, according to the respective embodiments) of digging of the first trenches 31 (or trenches 81), possibly after formation of a thin layer of pre-implantation oxide in the first trenches 31 (or trenches 81).

To prevent formation of implanted regions also on the internal wall of the trench 51, it is possible to form (as an alternative to what has been described for FIG. 13) the first trenches 31 and the second trench 51 in two distinct steps, and make the angled implantation immediately after formation of the first trenches 31 but prior to formation of the second trench 51.

Alternatively, it is possible to form the first trenches 31 and the second trench 51 at the same time and to protect the second trench 51 with an appropriate mask during the step of angled implantation. After the step of angled implantation, the remaining steps of manufacture of the electronic device, described with reference to FIG. 13-18 or 23-27, according to the respective embodiments, are carried out.

The angle of implantation of the angled implantation is comprised between ±10° and ±15° with respect to the direction of main extension (direction Z) of the first trench 31, with an implantation dose of from approximately $1 \cdot 10^{13}$ $Cm^{-2}$ to approximately $5 \cdot 10^{13}$ $cm^2$.

After the implantation, a thermal treatment of diffusion of the dopant species of the implanted drain regions is carried out to form a lightly doped drain (LDD) region. The drain region extends from the face 26a to the face 26b of the structural region 26, in electrical contact with the substrate 22. The implanted drain region, the substrate 22, and the metallization 41 form a drain electrode of the electronic device.

The various embodiments described above can be combined to provide further embodiments. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic semiconductor device, comprising:
a semiconductor body having a first side and a second side opposite to one another along an axis, including:
a first structural region facing the second side and having a first conductivity;
a second structural region extending over the first structural region, facing the first side and housing a drain region;
a body region, having a second conductivity opposite to the first conductivity, extending into the second structural region on the first side;
a source region, having the first conductivity, extending into the body region and facing the first side;
a gate electrode, extending over a portion of the first side of the semiconductor body;
a first trench, extending completely through the second structural region at a first side of the gate electrode and housing a first trench conductive region electrically insulated from the second structural region; and
a second trench, extending completely through the source region, the body region, and the second structural region at a second side opposite to the first side of the gate electrode, said second trench housing a second trench conductive region electrically insulated from the second structural region and electrically coupled to the body region and to the source region.

2. The device according to claim 1, further comprising:
a first spacer arranged between the first side of the gate electrode and the first trench conductive region; and
a second spacer arranged between the second side of the gate electrode and the second trench conductive region, the first and the second spacers have respective dimensions such that the first trench conductive region and the second trench conductive region are equally spaced apart respectively from the first side and the second side of the gate electrode.

3. The device according to claim 1 wherein the second structural region has said first conductivity and surrounds the body region to form said drain region of the electronic device.

4. The device according to claim 3 wherein the drain region is in electrical contact with the first structural region, and together they form a drain electrode of the electronic semiconductor device.

5. The device according to claim 3 wherein the drain region has a concentration of dopants comprised between $5 \cdot 1016$ and $1 \cdot 1017$ ions/cm3.

6. The device according to claim 1 wherein the structural region has said second conductivity and the drain region is an implanted region of a lightly doped drain type having the first conductivity and extends through the structural region, along said axis, starting from the first side of the semiconductor body.

7. The device according to claim 1 wherein the first trench and the second trench extend throughout a thickness of the second structural region and through part of the first structural region and terminate in the first structural region.

8. The device according to claim 1 wherein the second trench conductive region includes a first conductive portion, made of a first material, electrically insulated from the first structural region and the second structural region by a trench dielectric region, and a second conductive portion, made of a second material, different from the first material, electrically coupled to the source region and to the first conductive portion.

9. The device according to claim 8 wherein said first material is doped polysilicon and said second material includes tungsten, the first conductive portion extending in a proximity of a bottom of the second trench partially filling the second trench, and the second conductive portion extending over the first conductive portion, completely filling the second trench.

10. The device according to claim 1 wherein the first trench conductive region housed by the first trench includes a third conductive portion made of a third material and a fourth conductive portion made of a fourth material different from the third material and is electrically insulated from the first and second structural regions by a first trench dielectric region.

11. The device according to claim 10 wherein the first trench dielectric region has dimensions such that a thickness, along a direction orthogonal to said axis, of the first trench dielectric region plus the thickness of the first spacer is equal to the thickness, along the same direction, of the second spacer.

12. The device according to claim 1, further comprising a source metallization electrically coupled to the first trench conductive region and to the second trench conductive region that is configured to bias the first and second trench conductive regions at a same ground reference potential.

13. The device according to claim 1 wherein the first trench conductive region extends up to complete filling of the first trench, the device further comprising an electrical-insulation region, made of dielectric material, extending over the first trench conductive region, the first trench conductive region being electrically coupleable to a reference terminal at a ground reference potential by a trench metallization formed in peripheral regions of said device.

14. The device according to claim 13, further comprising a source metallization electrically coupled to the second trench conductive region configured to bias the second trench conductive region at the ground reference potential.

15. The device according to claim 1 wherein the first and second trench conductive regions extend for an entire extension of the second structural region.

16. An electronic semiconductor device, comprising:
a semiconductor substrate;
a first doped region on the substrate;
a drain region on the first doped region;
a body region on the drain region;
a source region on the body region;
a gate electrode on the body region and the source region;
a first trench extending completely through the first doped region and housing a first trench conductive region electrically insulated from the drain region; and
a second trench extending completely through the source region, the body region, and the drain region, said second trench housing a second trench conductive region electrically insulated from the drain region and electrically coupled to the body region and to the source region.

17. The device of claim 16 wherein:
the first doped region has a first conductivity;
the body region has a second conductivity; and
the source region has the first conductivity.

18. The device of claim 17 wherein the body region extends partially under the gate electrode.

19. The device of claim 18 wherein the body region is spaced from the first trench by a portion of the drain region.

* * * * *